(12) United States Patent
Liu et al.

(10) Patent No.: US 12,396,171 B2
(45) Date of Patent: Aug. 19, 2025

(54) METHOD OF FABRICATING THREE-DIMENSIONAL NAND MEMORY

(71) Applicant: Yangtze Memory Technologies Co., Ltd., Hubei (CN)

(72) Inventors: Yaqin Liu, Hubei (CN); Kun Zhang, Hubei (CN); Linchun Wu, Hubei (CN); Wenxi Zhou, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 539 days.

(21) Appl. No.: 17/709,668

(22) Filed: Mar. 31, 2022

(65) Prior Publication Data

US 2022/0367510 A1 Nov. 17, 2022

(30) Foreign Application Priority Data

May 14, 2021 (CN) .......................... 202110525974.1

(51) Int. Cl.
| | | |
|---|---|---|
| *H10B 43/27* | (2023.01) | |
| *H01L 21/78* | (2006.01) | |
| *H10B 41/27* | (2023.01) | |
| *H10B 41/41* | (2023.01) | |
| *H10B 43/10* | (2023.01) | |
| *H10B 43/20* | (2023.01) | |
| *H10B 43/35* | (2023.01) | |

(52) U.S. Cl.
CPC ......... *H10B 43/27* (2023.02); *H01L 21/7806* (2013.01); *H10B 41/27* (2023.02); *H10B 41/41* (2023.02); *H10B 43/10* (2023.02); *H10B 43/20* (2023.02); *H10B 43/35* (2023.02)

(58) Field of Classification Search
CPC ........ H10B 43/27; H10B 43/35; H10B 41/35; H10B 41/41; H01L 21/7806
See application file for complete search history.

(56) References Cited

U.S. PATENT DOCUMENTS 9,847,345 B2 * 12/2017 Mori .................. H10B 41/41
11,495,542 B2 * 11/2022 Kim .................. H10B 41/35
(Continued)

FOREIGN PATENT DOCUMENTS

| CN | 108565265 A | 9/2018 |
|---|---|---|
| CN | 110911417 A | 3/2020 |

(Continued)

*Primary Examiner* — Alonzo Chambliss
(74) *Attorney, Agent, or Firm* — HANLEY, FLIGHT & ZIMMERMAN, LLC

(57) ABSTRACT

The present disclosure provides a method for forming a three-dimensional (3D) memory device. The method includes forming a dielectric stack on a substrate, and forming a first opening penetrating through the dielectric stack and extending into the substrate from a first side of the dielectric stack. The method also includes forming a first layer and a second layer inside the first opening from the first side of the dielectric stack, wherein the first layer covers a sidewall and a bottom of the first opening. The method further includes removing a portion of the first layer located at the bottom of the first opening from a second side of the dielectric stack to expose a portion of the second layer. The method further includes forming a second semiconductor layer from the second side of the dielectric stack to contact the exposed portion of the second layer.

12 Claims, 19 Drawing Sheets

(56) References Cited

U.S. PATENT DOCUMENTS

| | | | | |
|---|---|---|---|---|
| 11,716,853 B2* | 8/2023 | Wu | ................... | H10B 43/35 |
| | | | | 257/314 |
| 11,792,984 B2* | 10/2023 | Mori | ................... | H10B 41/27 |
| | | | | 257/314 |
| 2016/0049422 A1* | 2/2016 | Kim | ................... | H10B 43/27 |
| | | | | 257/329 |
| 2018/0294225 A1* | 10/2018 | Lee | ................... | H10B 43/40 |
| 2023/0132530 A1* | 5/2023 | Wu | ................... | H10B 43/50 |
| | | | | 438/273 |

FOREIGN PATENT DOCUMENTS

| | | |
|---|---|---|
| CN | 111900171 A | 11/2020 |
| CN | 112185980 A | 1/2021 |
| CN | 112466888 A | 3/2021 |

\* cited by examiner

METHOD OF FABRICATING THREE-DIMENSIONAL NAND MEMORY

CROSS-REFERENCE TO RELATED APPLICATIONS AND INCORPORATION BY REFERENCE

This application claims priority to Chinese Patent Application No. 202110525974.1, filed on May 14, 2021, which is incorporated herein by reference in its entirety.

TECHNICAL FIELD

The present disclosure generally relates to the field of semiconductor technology, and more particularly, to a three-dimensional NAND flash memory and its fabrication methods.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND memory, many layers of memory cells can be stacked vertically such that storage density per unit area can be greatly increased. The number of vertically stacked layers can also be increased to further increase the storage capacity. In the meantime, a memory block in a 3D NAND memory can be divided into multiple sub-storage units by, for example, a gate line slit (GLS or a slit structure) such that reading and programming speed can be improved. To electrically isolate gate electrodes between different sub-storage units, a GLS isolation layer can be disposed inside the GLS, followed up a GLS filler.

BRIEF SUMMARY

Embodiments of a three-dimensional (3D) memory device and a method for forming the same are described in the present disclosure.

One aspect of the present disclosure provides a method for forming a three-dimensional (3D) memory device. The method includes forming a laminate structure (e.g., a dielectric stack) on the substrate; and forming a channel structure and a gate line slit (GLS) opening that penetrates through the laminated structure and extends into the substrate. The channel structure includes a memory film and a channel layer. The method further includes forming conductive layers (or gate electrodes) in the laminated structure through the GLS opening. The method also includes disposing an isolation layer on a sidewall of the GLS opening; and disposing a GLS filler inside the GLS opening. The method further includes removing a portion of the substrate, a portion of the isolation layer and a portion of the memory film to expose the GLS filler and the channel layer on a side of the substrate further away from the laminated structure. The method also includes forming an array common source (i.e., a second semiconductor layer) in contact with the exposed GLS filler and channel layer on the side of the remaining substrate away from the laminated structure.

In some embodiments, the method further includes, prior to forming the conductive layers, disposing a gate dielectric layer inside the GLS opening; and prior to disposing the isolation layer, removing a portion of the gate dielectric layer located on a bottom of the GLS opening.

In some embodiments, the disposing the isolation layer includes disposing a first isolation layer (i.e., first GLS isolation layer) on the sidewall of the GLS opening; removing a portion of the first isolation layer located at the bottom of the GLS opening to expose the substrate; and disposing a second isolation layer (i.e., second GLS isolation layer) on the sidewall of the GLS opening.

In some embodiments, the removing the portion of the substrate includes removing the portion of the substrate to expose a portion of the second isolation layer located at the bottom of the GLS opening and the portion of the memory film.

In some embodiments, the removing of the portion of the isolation layer includes removing the portion of the second isolation layer at the bottom of the GLS opening to expose the GLS filler inside the GLS opening.

In some embodiments, the removing of the portion of the memory film includes removing the exposed portion of the memory film simultaneously with the portion of the second isolation layer to expose the channel layer.

In some embodiments, the disposing the first isolation layer on the sidewall of the GLS opening includes disposing sequentially a first sub-layer insulator and a second sub-layer insulator on the sidewall of the GLS opening.

In some embodiments, the disposing the GLS filler includes depositing polycrystalline silicon.

In some embodiments, the forming the array common source includes depositing polycrystalline silicon.

Another aspect of the present disclosure provides a three-dimensional (3D) memory device. The 3D memory device includes a film stack disposed on an array common source (or second semiconductor layer). The 3D memory device also includes a channel structure (or memory string) penetrating vertically through the film stack, wherein the channel structure includes a channel layer and a memory film covering an outer sidewall of the channel layer. The 3D memory device further includes a gate line slit (GLS) (or slit structure) penetrating vertically through the film stack, wherein the GLS includes a GLS filler and an isolation layer surrounding the GLS filler. The array common source contacts the GLS filler and the channel layer.

In some embodiments, the GLS filler includes polycrystalline silicon.

In some embodiments, the array common source includes polycrystalline silicon.

In some embodiments, the isolation layer includes a first isolation layer (i.e., a first GLS isolation layer) and a second isolation layer (i.e., a second GLS isolation layer).

In some embodiments, the first isolation layer includes a first sub-layer insulator and a second sub-layer insulator.

In some embodiments, the first isolation layer and the second isolation layer includes silicon oxide.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
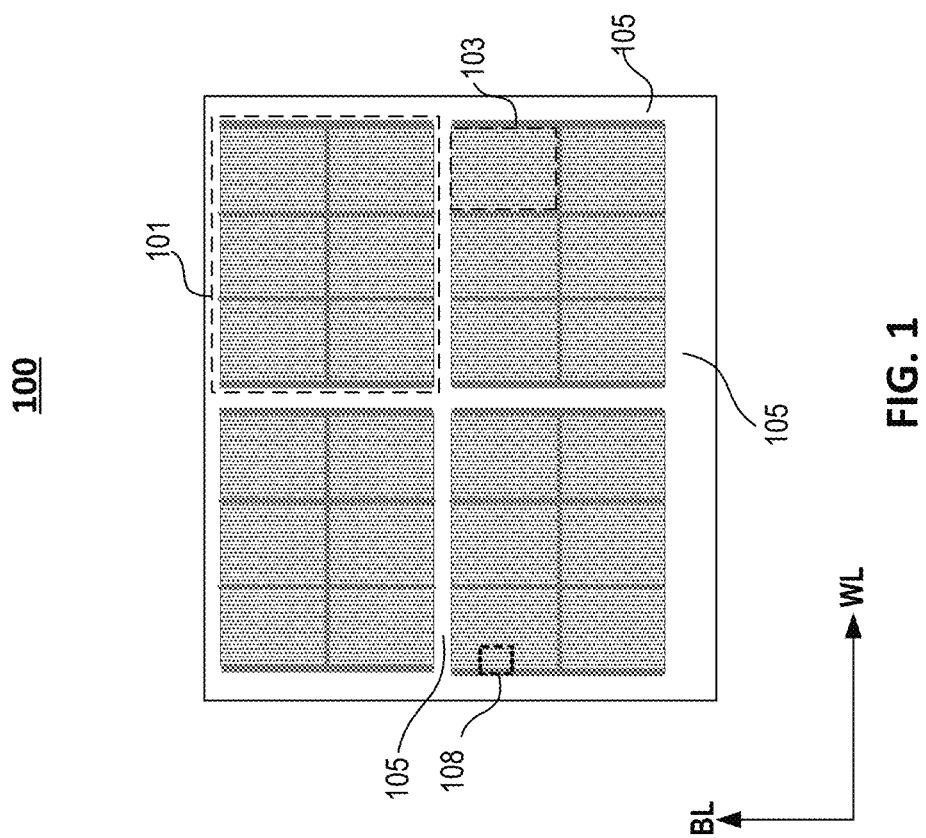
FIG. 1 illustrates a schematic top-down view of an exemplary three-dimensional (3D) memory die, according to some embodiments of the present disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

The term "or," as used herein, is inclusive; more specifically, the phrase "A or B" means "A, B, or both A and B." Exclusive "or" is designated herein by terms such as "either A or B" and "one of A or B," for example.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain un-patterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a top-down view of an exemplary three-dimensional (3D) memory device 100, according to some embodiments of the present disclosure. The 3D memory device 100, such as 3D NAND Flash memory, can be a memory chip (package), a memory die or any portion of a memory die, and can include one or more memory planes 101, each of which can include memory blocks 103. Identical and concurrent operations can take place at each memory plane 101. The memory block 103, which can be megabytes (MB) in size, is the smallest size to carry out erase operations. Shown in FIG. 1, the exemplary 3D memory device 100 includes four memory planes 101 and each memory plane 101 includes six memory blocks 103. Each memory block 103 can include memory cells, where each memory cell can be addressed through interconnections such as bit lines and word lines. The bit lines and word lines can be laid out perpendicularly (e.g., in rows and columns, respectively), forming an array of metal lines. The directions of bit lines and word lines are labeled as "BL" and "WL" in FIG. 1 and are referred to as a BL-direction and a WL-direction. In this disclosure, memory block 103 is also referred to as a "memory array" or "array." The memory array is the core area in a memory device, performing storage functions.

The 3D memory device 100 also includes a periphery region 105, an area surrounding memory planes 101. The periphery region 105 contains many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

It is noted that, the arrangement of the memory planes 101 in the 3D memory device 100 and the arrangement of the memory blocks 103 in each memory plane 101 illustrated in FIG. 1 are only used as an example, which does not limit the scope of the present disclosure.

Figure 2:
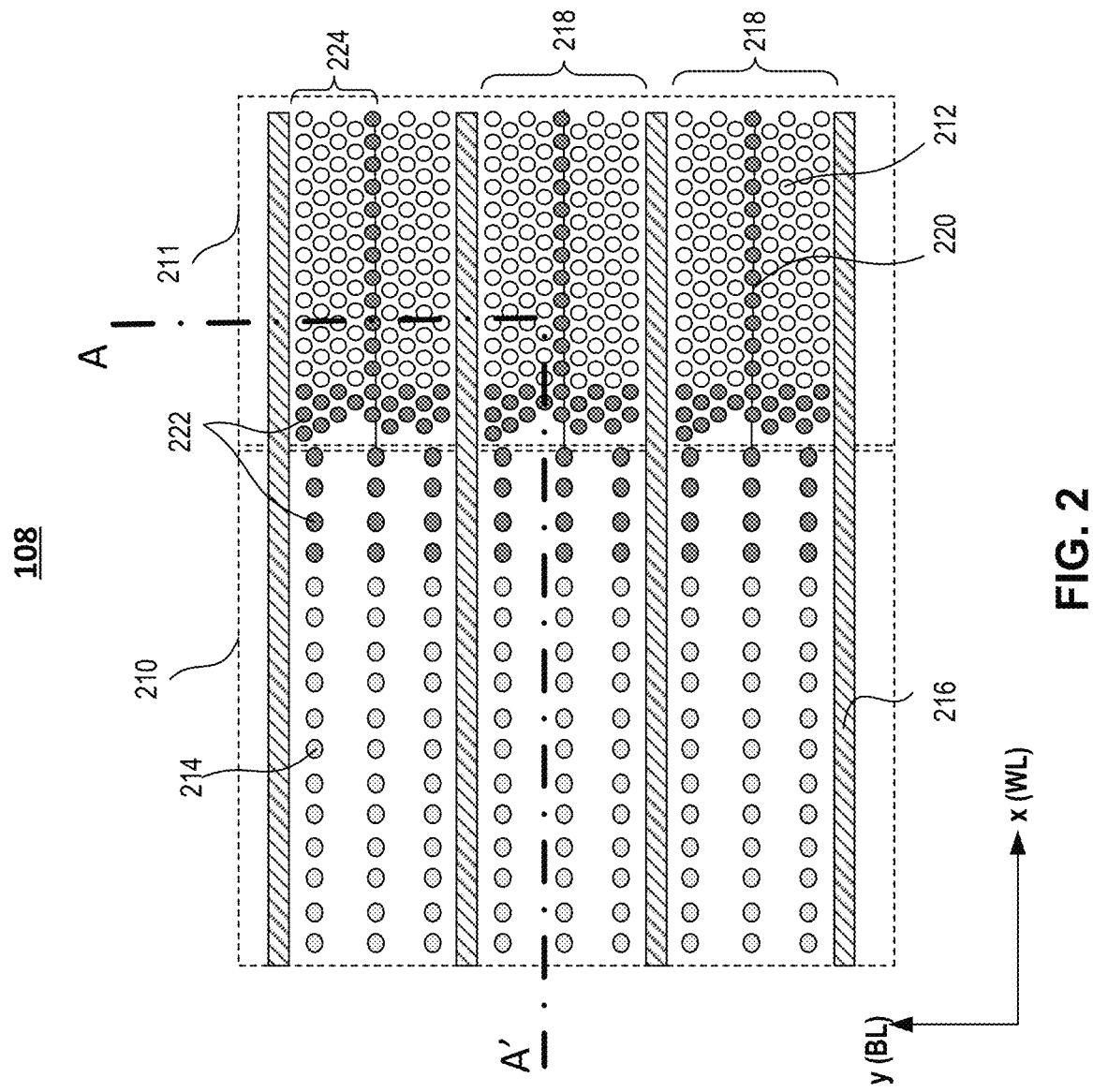
FIG. 2 illustrates a schematic top-down view of a region of 3D memory die, according to some embodiments of the present disclosure.

Referring to FIG. 2, an enlarged top-down view of a region 108 in FIG. 1 is illustrated, according to some embodiments of the present disclosure. The region 108 of the 3D memory device 100 can include a staircase region 210 and a channel structure region 211. The channel structure region 211 can include an array of memory strings 212, each including stacked memory cells. The staircase region 210 can include a staircase structure and an array of contact structures 214 formed on the staircase structure. In some embodiments, slit structures 216 (also referred to as gate line slits), extending in the WL-direction (or x-direction) across the channel structure region 211 and the staircase region 210, can divide a memory block into multiple memory fingers 218. At least some slit structures 216 can function as the common source contact (e.g., for array common source or ACS) for an array of memory strings 212 in channel structure regions 211. A top select gate cut 220 can be disposed, for example, in the middle of each memory finger 218 to divide a top select gate (TSG) of the memory finger 218 into two portions, and thereby can divide a memory finger into two memory slices 224, where memory cells in a memory slice 224 that share the same word line form a programmable (read/write) memory page. While erase operation of a 3D NAND memory can be carried out at memory block level, read and write operations can be carried out at memory page level. A memory page can be kilobytes (KB) in size. In some embodiments, region 108 also includes dummy memory strings 222 for process variation control during fabrication and/or for additional mechanical support.

Figure 3:
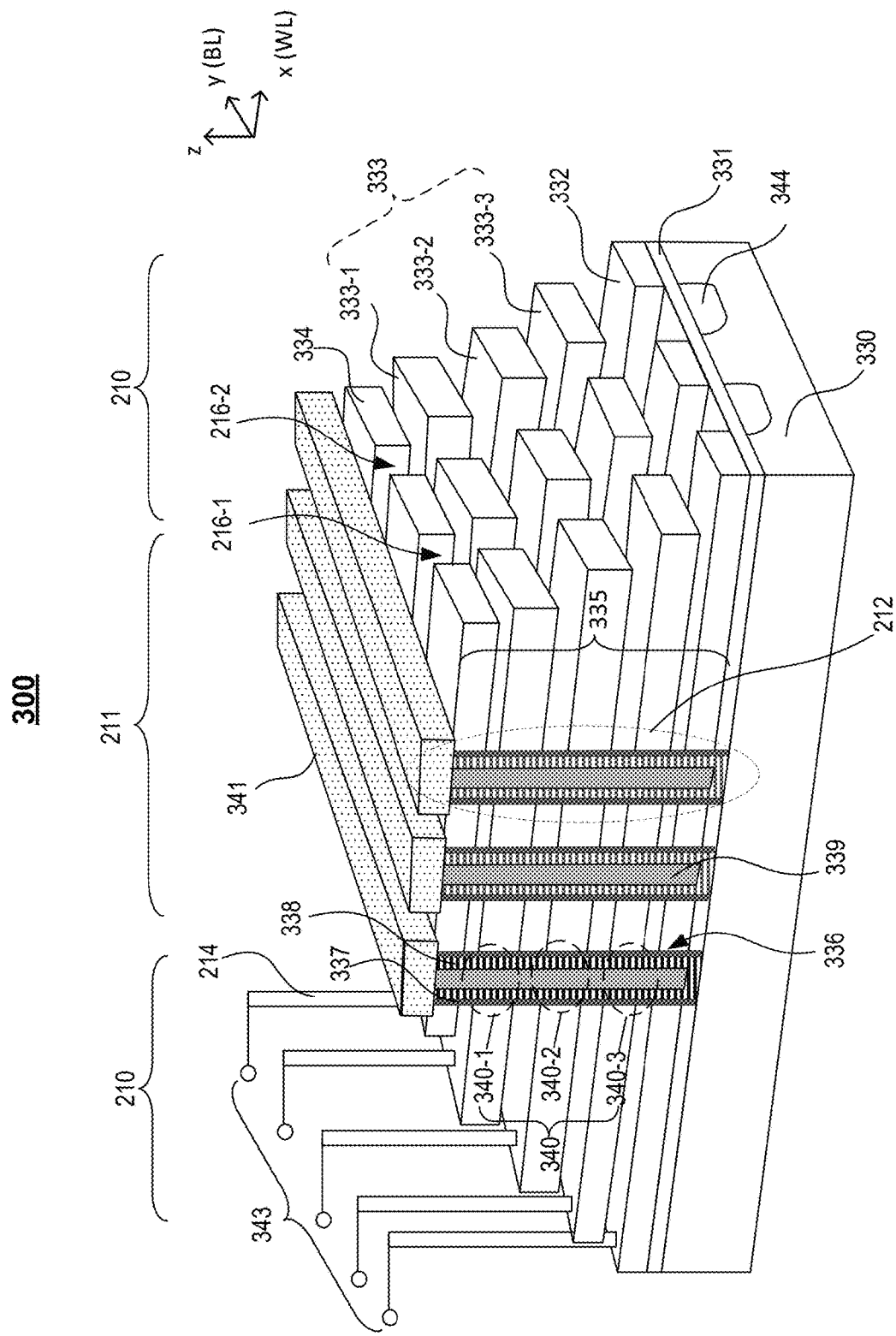
FIG. 3 illustrates a perspective view of a portion of an exemplary 3D memory array structure, in accordance with some embodiments of the present disclosure.

FIG. 3 illustrates a perspective view of a portion of an exemplary three-dimensional (3D) memory array structure 300, according to some embodiments of the present disclosure. The memory array structure 300 includes a substrate 330, an insulating film 331 over the substrate 330, a tier of bottom select gates (BSGs) 332 over the insulating film 331, and tiers of control gates 333, also referred to as "word lines (WLs)," stacking on top of the BSGs 332 to form a film stack 335 of alternating conductive and dielectric layers in a z-direction. The dielectric layers adjacent to the tiers of control gates are not shown in FIG. 3 for clarity.

The control gates of each tier are separated by slit structures 216-1 and 216-2 through the film stack 335 in the WL-direction (or the x-direction). The memory array structure 300 also includes a tier of top select gates (TSGs) 334 over the stack of control gates 333. The stack of TSG 334, control gates 333 and BSG 332 is also referred to as "gate electrodes". The memory array structure 300 further includes memory strings 212 and doped source line regions 344 in portions of substrate 330 between adjacent BSGs 332. Each memory strings 212 includes a channel hole 336 extending through the insulating film 331 and the film stack 335 of alternating conductive and dielectric layers in the z-direction. Memory strings 212 also includes a memory film 337 on a sidewall of the channel hole 336, a channel layer 338 over the memory film 337, and a core filler 339 surrounded by the channel layer 338. A memory cell 340 (e.g., 340-1, 340-2, 340-3) can be formed at the intersection of the control gate 333 (e.g., 333-1, 333-2, 333-3) and the memory string 212. A portion of the channel layer 338 responds to the respective control gate is also referred to as the channel layer 338 of the memory cell. The memory array structure 300 further includes bit lines (BLs) 341 that extend in the BL-direction (or the y-direction) and are connected with the memory strings 212 over the TSGs 334. The memory array structure 300 also includes metal interconnect lines 343 connected with the gate electrodes through contact structures 214. The edge of the film stack 335 is configured in a shape of staircase to allow an electrical connection to each tier of the gate electrodes.

In FIG. 3, for illustrative purposes, three tiers of control gates 333-1, 333-2, and 333-3 are shown together with one tier of TSG 334 and one tier of BSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The memory array structure 300 can also include other structures, for example, TSG cut, common source contact, array common source and dummy memory string. These structures are not shown in FIG. 3 for simplicity.

In a 3D NAND memory, many layers of memory cells can be stacked vertically such that storage density per unit area can be greatly increased. The number of vertically stacked layers can be greatly increased to further increase the storage density. However, the resulting high aspect ratio structure can be very challenging to fabricate. For example, channel holes are etched through the stacked structure, where memory films and channel layers are disposed inside the channel holes. To form source contact (e.g., an array common source (ACS)) to the channel layers, memory films at a bottom of the channel holes need to be removed. However, removing memory films from the bottom of the channel holes can cause damage on the memory film on the sidewall. Pin holes in the channel layers can cause reliability issues and lower product yield. Alternatively, the source contact to the channel layers can be formed from a backside of the substrate so as to avoid these processing issues.

On the other hand, a memory block in a 3D NAND memory can usually be divided into multiple sub-storage units. For example, the gate line slit (GLS or slit structure) 216 can be used to separate a memory block into memory fingers 218 (see FIG. 2) that can perform read or program operations independently. To electrically isolate the gate electrodes (e.g., word lines 333) between different sub-storage units (e.g., the memory fingers 218), an isolation layer can be disposed on a sidewall of a GLS opening. Subsequently, a GLS filler can be disposed to fill up the GLS opening to form the GLS 216.

While the isolation layer on the sidewall of the GLS opening can electrically isolate gate electrodes between different sub-storage units, the isolation layer disposed at a bottom of the GLS opening can also electrically isolate the GLS filler of the GLS 216 and the ACS formed underneath the film stack 335. Therefore, the GLS filler of the GLS 216 can be left floating, i.e., not applied with any voltage. As a result, capacitive coupling effect can occur between adjacent sub-storage units. For example, when one sub-storage unit is selected to perform a read or program operation, unselected sub-storage unit adjacent to the selected sub-storage unit can be affected by the capacitive coupling effect. Charge carriers can accumulate around the unselected sub-storage unit, for example, in the ACS around the memory strings in the unselected sub-storage unit. Electrical potentials of the memory cells in the unselected sub-storage units can thereby be affected. Performance and reliability of the 3D NAND memory can be affected accordingly. As the numbers of the memory blocks and/or sub-storage units continue increasing, the capacitive coupling effect can become more sever. Therefore, a need exists to provide a 3D NAND memory and a fabrication method to reduce the capacitive couple effect between memory blocks and sub-storage units.

Figure 4:
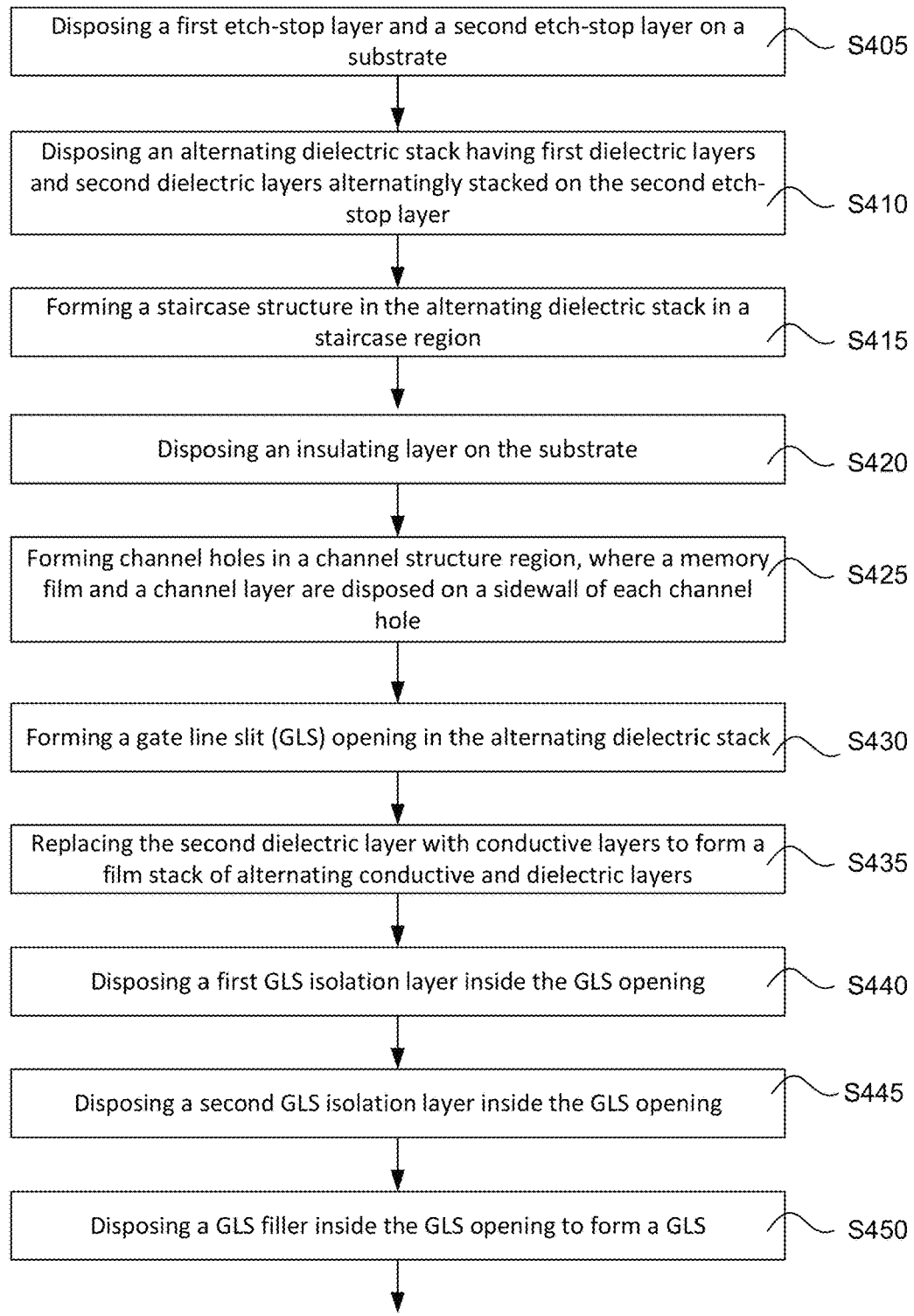
FIG. 4 illustrates a method for forming a 3D memory device, according to some embodiments of the present disclosure.
Figure 4:
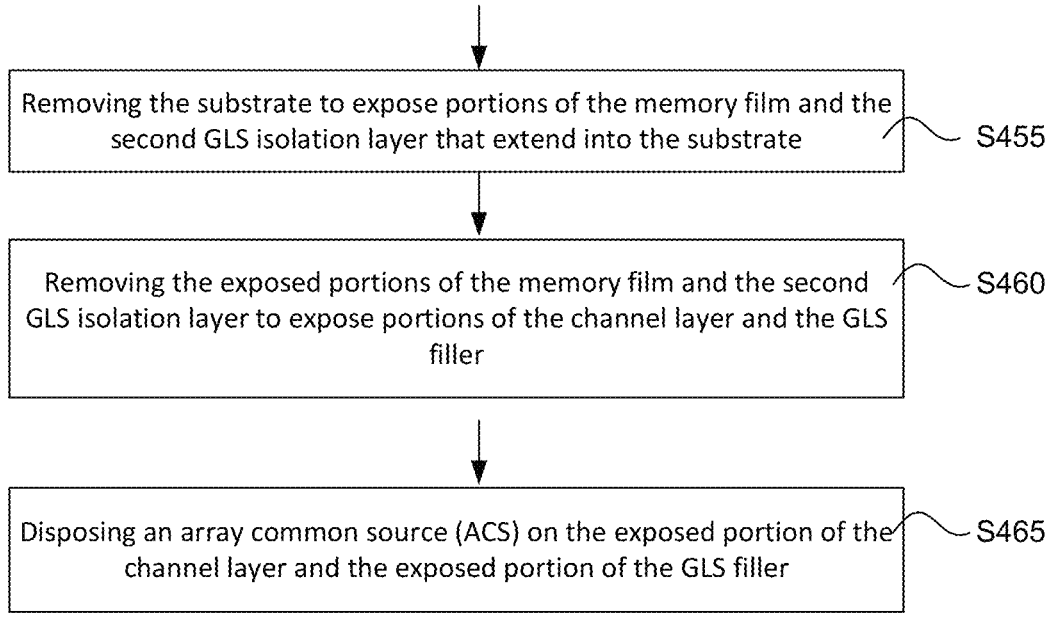

FIG. 4 illustrates a method 400 for forming a three-dimensional (3D) memory device, according to some embodiments of the present disclosure. It should be understood that process steps shown in method 400 are not exhaustive and that other steps can be performed as well before, after, or between any of the illustrated steps. In some embodiments, some process steps of method 400 can be omitted, or other process steps can also be included, which are not described here for simplicity. In some embodiments, process steps of method 400 can be performed in a different order and/or vary.

FIGS. 5-15 illustrate cross-sectional views of exemplary structures of the 3D memory device at certain process steps according to the method 400. The cross-sectional views in FIGS. 5-15 are drawn along line AA' in FIG. 2. It is noted that structures described in these cross-sections are illustrated as examples only and should not be so limited.

Referring to FIG. 4, at process step S405, a first etch-stop layer and a second etch-stop layer can be disposed sequentially on a front side of a substrate. A cross-sectional view of an exemplary 3D memory structure 500 is shown in FIG. 5, according to the process step S405.

Figure 5:
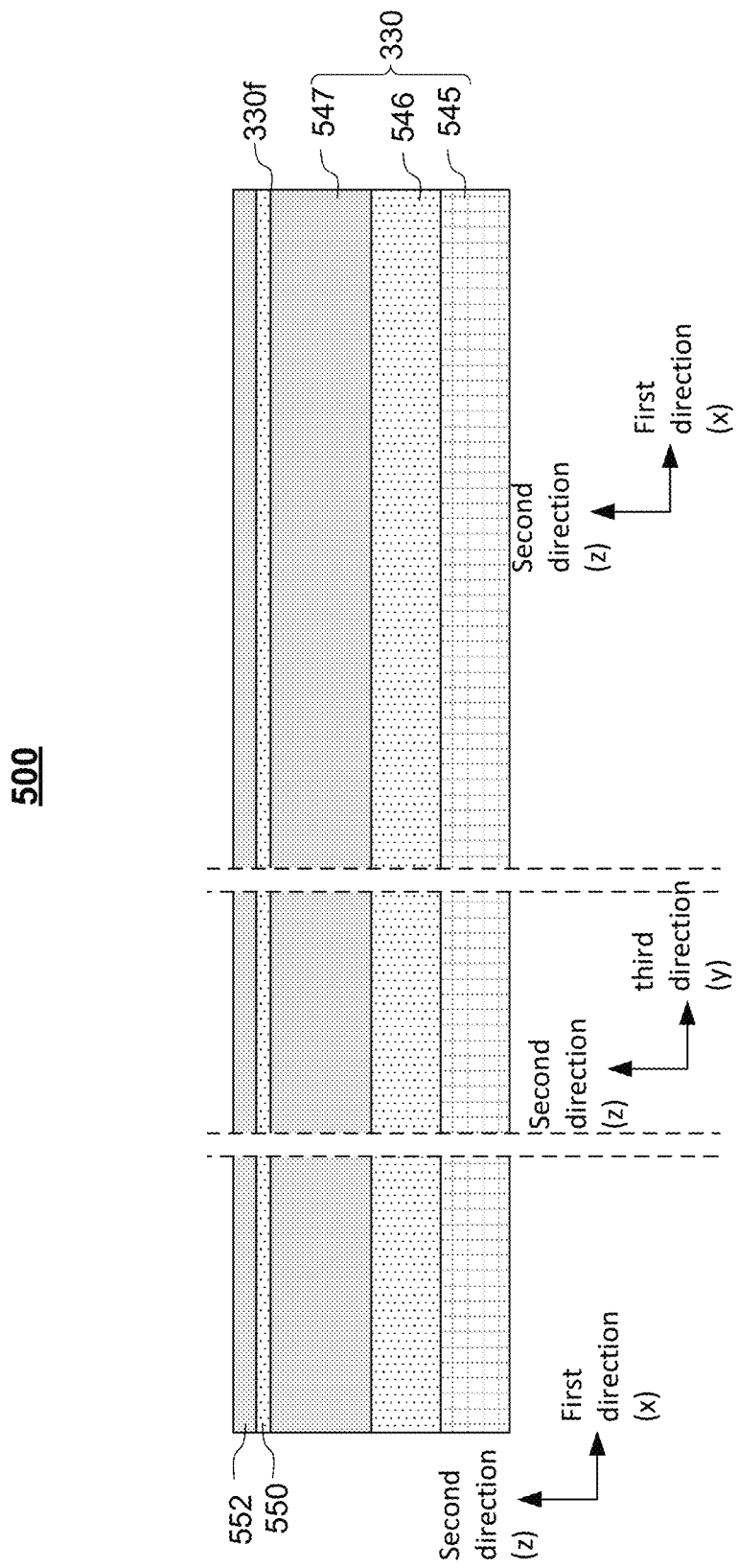
FIGS. 5-15 illustrate cross-sectional views of 3D memory structures at certain process step, according to some embodiments of the present disclosure.

As shown in FIG. 5, the 3D memory structure 500 includes a first etch-stop layer 550 disposed on a front side of the substrate 330 (also referred to as a first side of the substrate 330), and a second etch-stop layer 552 disposed on the first etch-stop layer 550.

The substrate 330 can provide a platform for forming subsequent structures. In some embodiments, the substrate 330 can be any suitable semiconductor substrate having any suitable semiconductor materials, such as monocrystalline, polycrystalline or single crystalline semiconductors. For example, the substrate 330 can include silicon, silicon germanium (SiGe), germanium (Ge), gallium arsenide (GaAs), gallium nitride, silicon carbide, III-V compound, II-VI compound, or any combinations thereof.

In some embodiments, the substrate 330 can have a composite structure and include a first semiconductor layer 547 formed on a handle wafer 545. The substrate 330 also include an insulator layer 546 located in between the first semiconductor layer 547 and the handle wafer 545. The handle wafer 545 can include glass, plastic, or another semiconductor substrate. The first semiconductor layer 547 can include any suitable monocrystalline, polycrystalline or single crystalline semiconductors, for example, silicon, silicon germanium (SiGe), germanium (Ge), gallium arsenide (GaAs), gallium nitride, silicon carbide, III-V compound, II-VI compound, or any combinations thereof. The insulator layer 546 can include silicon oxide, silicon nitride, silicon oxynitride, TEOS, or any combination thereof. In some embodiments, the insulator layer 546 is silicon oxide and is also referred to as the first silicon oxide layer. In some embodiments, the first semiconductor layer 547 is polycrystalline silicon and is also referred to as the first polycrystalline silicon layer. In some embodiments, the substrate 330 can be silicon-on-insulator (SOI), germanium-on-insulator (GOI), or silicon germanium-on-insulator (SGOI), where the first semiconductor layer 547 can be crystalline silicon, crystalline germanium or crystalline silicon germanium.

In some embodiments, the first semiconductor layer 547 can be disposed on the insulator layer 546 and the handle wafer 545 by using a deposition method such as, chemical vapor deposition (CVD), physical vapor deposition (PVD), plasma-enhanced CVD (PECVD), rapid thermal chemical vapor deposition (RTCVD), low pressure chemical vapor deposition (LPCVD), sputtering, metal-organic chemical vapor deposition (MOCVD), atomic layer deposition (ALD), high-density-plasma CVD (HDP-CVD), sputtering, evaporation, and/or combinations thereof. In some embodiments, the first semiconductor layer 547 can be formed on the insulator layer 546 and the handle wafer 545 through wafer bonding, SIMOX, etc.

A front surface 330f of the substrate 330 is also referred to as a "main surface" or a "top surface" of the substrate herein. Layers of materials can be disposed on the front surface 330f of the substrate 330. A "topmost" or "upper" layer is a layer farthest or farther away from the front surface 330f of the substrate. A "bottommost" or "lower" layer is a layer closest or closer to the front surface 330f of the substrate.

At process step S405, the first etch-stop layer 550 can be formed on the front surface 330f of the substrate 330, and the second etch-stop layer 552 can be formed on the first etch-stop layer 550. In some embodiments, the first etch-stop layer 550 and the second etch-stop layer 552 can be formed on the first semiconductor layer 547 of the substrate 330. The first etch-stop layer 550 and the second etch-stop layer 552 extend in a lateral direction (e.g., a first direction) that is parallel to the front surface 330f of the substrate 330.

The first etch-stop layer 550 and the second etch-stop layer 552 can be used as etch-stop layers in subsequent etching processes. The first etch-stop layer 550 and the second etch-stop layer 552 can be disposed by a thin film deposition process such as CVD, PVD, ALD, sputtering, evaporation, and/or any combination thereof. In some embodiments, the first etch-stop layer 550 can include silicon oxide, silicon nitride, silicon oxynitride, TEOS, etc. In some embodiments, the first etch-stop layer 550 can include silicon oxide and is also referred to as the second silicon oxide layer. In some embodiments, the second etch-stop layer 552 can include amorphous or polycrystalline silicon and is also referred to as the second polycrystalline silicon layer. It should be noted that the first etch-stop layer 550 and the second etch-stop layer 552 can include any suitable material that has a predetermined etching selectivity (i.e. ratio of etching rate) with respect to materials to be etched.

Referring to FIG. 4, at process step S410, a dielectric stack can be disposed on the second etch-stop layer over the substrate. At process step S415, a staircase structure can be formed in the dielectric stack. At process step S420, an insulating layer can be disposed over the substrate, covering the staircase structure. A cross-sectional view of an exemplary 3D memory structure 600 is shown in FIG. 6, according to the process steps S410-S420.

Figure 6:
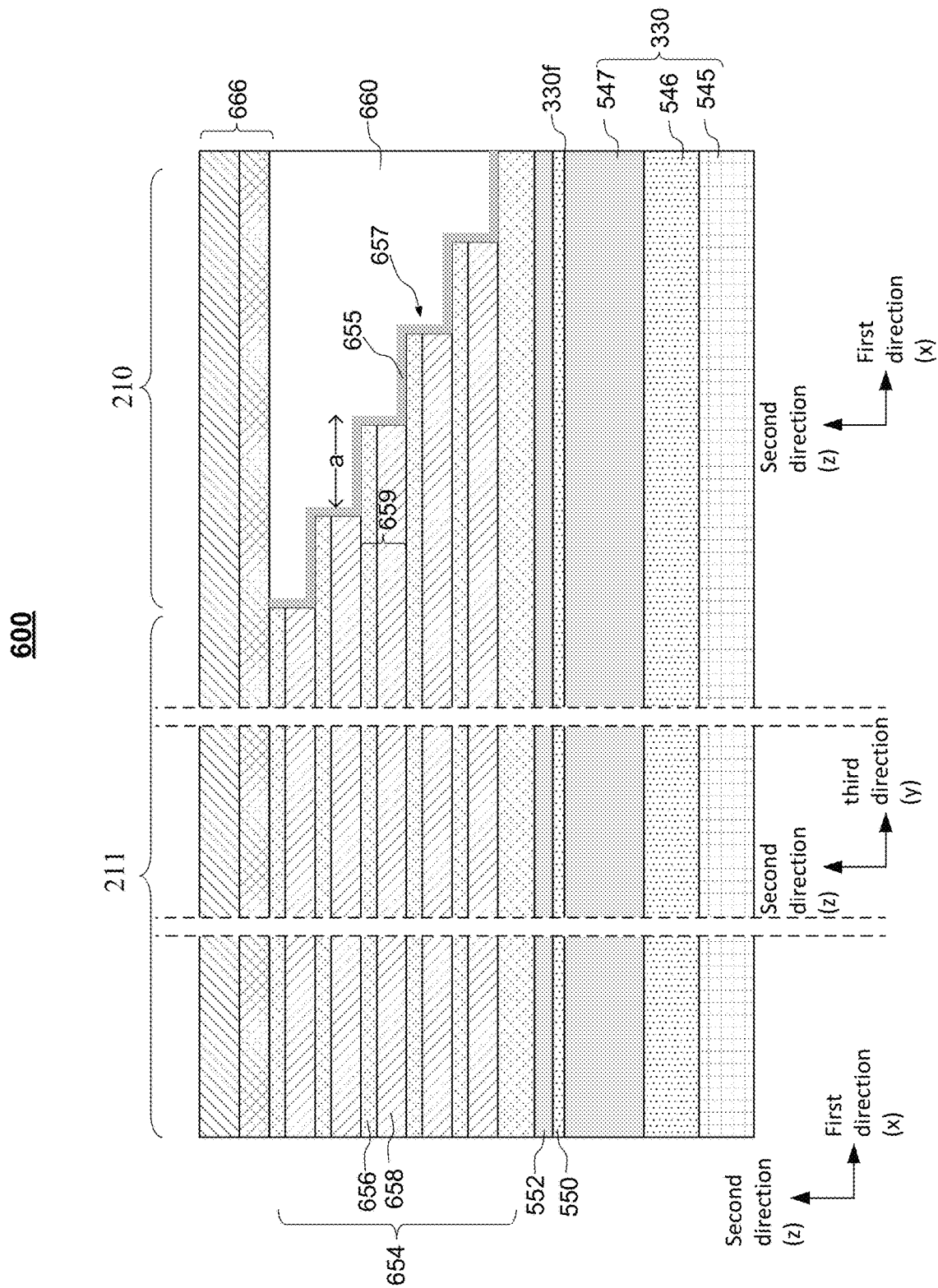

As shown in FIG. 6, the 3D memory structure 600 includes a dielectric stack 654 having first dielectric layers 656 and second dielectric layers 658 alternatingly stacked on the second etch-stop layer 552 in a second direction (or the z-direction). The dielectric stack 654 extends parallel to the substrate 330, along the first direction (or the x-direction) and the third direction (or the y-direction).

In some embodiments, the dielectric stack 654 includes dielectric layer pairs alternatingly stacked along a vertical direction (i.e., the second direction) perpendicular to the front surface 330f of the substrate 330, where each dielectric layer pair includes the first dielectric layer 656 (also referred to as "dielectric layer") and the second dielectric layer 658 (also referred to as "sacrificial layer") that is different from the first dielectric layer 656. The dielectric stack 654 extends in the first direction that is parallel to the front surface 330f of the substrate 330. The first direction is perpendicular to the second direction.

In the dielectric stack 654, first dielectric layers 656 and second dielectric layers 658 alternate in the second direction perpendicular to the substrate 330. In the other words, each second dielectric layer 658 can be sandwiched between two first dielectric layers 656, and each first dielectric layer 656 can be sandwiched between two second dielectric layers 658 (except the bottommost and the topmost layer).

The formation of the dielectric stack 654 can include disposing the first dielectric layers 656 to each have the same thickness or to have different thicknesses. Example thicknesses of the first dielectric layers 656 can range from 10 nm to 500 nm, preferably from about 20 nm to about 30 nm. Similarly, the second dielectric layer 658 can each have the same thickness or have different thicknesses. Example thicknesses of the second dielectric layer 658 can range from 10 nm to 500 nm, preferably from about 25 nm to about 40 nm. It should be understood that the number of dielectric layer pairs in FIG. 6 is for illustrative purposes only and that any suitable number of layers may be included in the dielectric stack 654.

In some embodiments, the first dielectric layer 656 includes any suitable insulating materials, for example, silicon oxide, silicon oxynitride, silicon nitride, TEOS or silicon oxide with F-, C-, N-, and/or H-incorporation. The first dielectric layer 656 can also include high-k dielectric materials, for example, hafnium oxide, zirconium oxide, aluminum oxide, tantalum oxide, or lanthanum oxide films. In some embodiments, the first dielectric layer 656 can be any combination of the above materials.

The formation of the first dielectric layer 656 can include any suitable deposition methods such as, chemical vapor deposition (CVD), physical vapor deposition (PVD), plasma-enhanced CVD (PECVD), rapid thermal chemical vapor deposition (RTCVD), low pressure chemical vapor deposition (LPCVD), sputtering, metal-organic chemical vapor deposition (MOCVD), atomic layer deposition (ALD), high-density-plasma CVD (HDP-CVD), sputtering, evaporation, thermal oxidation, nitridation, any other suitable deposition method, and/or combinations thereof.

In some embodiments, the second dielectric layer 658 includes any suitable material that is different from the first dielectric layer 656 and can be removed selectively with respect to the first dielectric layer 656. For example, the second dielectric layer 658 can include silicon oxide, silicon oxynitride, silicon nitride, TEOS, poly-crystalline silicon, poly-crystalline germanium, poly-crystalline germanium-silicon, and any combinations thereof. In some embodiments, the second dielectric layer 658 also includes amorphous semiconductor materials, such as amorphous silicon or amorphous germanium. The second dielectric layer 658 can be disposed using a similar technique as the first dielectric layer 656, such as CVD, PVD, ALD, sputtering, evaporation, thermal oxidation or nitridation, or any combination thereof.

In some embodiments, the first dielectric layer 656 can be silicon oxide and the second dielectric layer 658 can be silicon nitride.

In some embodiments, the dielectric stack 654 can include layers in addition to the first dielectric layer 656 and the second dielectric layer 658, and can be made of different materials and/or with different thicknesses.

As shown in FIG. 6, the 3D memory structure 600 also includes a staircase structure 657 with staircase steps 659 formed in the dielectric stack 654 in the staircase region 210.

The staircase step 659, or a "staircase layer", refers to a layer stack with the same lateral dimension in a surface parallel to the substrate surface 330*f*. In the first direction, each staircase step terminates at a shorter length than the staircase step underneath, with a lateral dimension "a" shown in FIG. 6.

In some embodiments, each of the staircase steps 659 includes one pair of the first dielectric layer 656 and the second dielectric layer 658. In some embodiments, each of the staircase steps 659 can include two or more pairs of the first dielectric layer 656 and the second dielectric layer 658. As shown in FIG. 6, each of the staircase steps 659 includes one pair of the first dielectric layer 656 and the second dielectric layer 658. Each of the staircase steps 659 can expose a portion of the first dielectric layer 656 or the second dielectric layer 658 at the end of dielectric stack 654.

The staircase structure 657 can be formed by applying a repetitive etch-trim process on the dielectric stack 654. The etch-trim process includes an etching process and a trimming process. During the etching process, a portion of the staircase step 659 with exposed surface can be removed. The remaining portion of the staircase step 659, either covered by upper levels of staircase steps or covered by a patterning mask, is not etched. The etch depth is a thickness of the staircase step 659. In some embodiments, the thickness of the staircase step 659 is a thickness of one pair of the first dielectric layer 656 and the second dielectric layer 658. The etching process for the first dielectric layer 656 can have a high selectivity over the second dielectric layer 658, and/or vice versa. Accordingly, an underlying dielectric layer pair can function as an etch-stop layer. By switching etching process for each layer, the staircase step 659 can be etched during an etching cycle. And as a result, one of the staircase steps 659 can be formed during each etch-trim cycle. In some embodiments, the first dielectric layer 656 and the second dielectric layer 658 can be etched at a similar etching rate.

In some embodiments, the staircase step 659 can be etched using an anisotropic etching such as a reactive ion etch (RIE) or other dry etch processes. In some embodiments, the first dielectric layer 656 is silicon oxide. In this example, the etching of silicon oxide can include RIE using fluorine based gases, for example, carbon-fluorine ($CF_4$), hexafluoroethane ($C_2F_6$), $CHF_3$, or $C_3F_6$ and/or any other suitable gases. In some embodiments, the silicon oxide layer can be removed by wet chemistry, such as hydrofluoric acid or a mixture of hydrofluoric acid and ethylene glycol. In some embodiments, a timed etching approach can be used. In some embodiments, the second dielectric layer 658 is silicon nitride. In this example, the etching of silicon nitride can include RIE using $O_2$, $N_2$, $CF_4$, $NF_3$, $Cl_2$, HBr, $BCl_3$, and/or combinations thereof. The methods and etchants to remove a single layer stack should not be limited by the embodiments of the present disclosure.

The trimming process includes applying a suitable etching process (e.g., an isotropic dry etch or a wet etch) on the patterning mask such that the patterning mask can be pulled back laterally. The lateral pull-back dimension determines the lateral dimension "a" of each step of the staircase structure 657. After trimming the patterning mask, one portion of a topmost staircase step 659 is exposed and the other portion of the topmost staircase step 659 remains covered by the patterning mask. The next cycle of etch-trim process resumes with the etching process. In some embodiments, the patterning mask trimming process can include dry etching, such as ME using $O_2$, Ar, $N_2$, etc. It is noted that the number of staircase structures and the number of dielectric layer pairs in the 3D memory structure 600 are not limited to the examples herein.

As shown in FIG. 6, the 3D memory structure 600 also includes an insulating layer 660 disposed over the substrate 330, covering the staircase structure 657. The insulating layer 660 can include any suitable insulating material, for example, silicon oxide, silicon oxynitride, silicon nitride, TEOS, spin-on-glass, low-k dielectric material, such as carbon-doped oxide (CDO or SiOC or SiOC:H), or fluorine doped oxide (SiOF), etc. The insulating layer 660 can be disposed by CVD, PVD, ALD, sputtering, evaporating, etc. In some embodiments, the insulating layer 660 can have a planar top surface over the staircase structure 657 and the dielectric stack 654. The insulating layer 660 can be planarized using CMP and/or RIE etch-back.

In some embodiments, a barrier layer 655 can be disposed on the staircase structure 657, prior to disposing the insulating layer 660. The barrier layer 655 can cover the staircase structure 657 on both lateral surfaces and vertical sidewalls. The barrier layer 655 on lateral surfaces and vertical sidewalls can have the same or different thicknesses. The barrier layer 655 can function as an etch-stop for forming contact structures on the staircase steps.

The 3D memory structure 600 also includes a first capping layer 666, disposed on the insulating layer 660. The first capping layer 666 can include silicon oxide, silicon nitride, silicon oxynitride, TEOS, or a combination thereof. The first capping layer 666 can be deposited by CVD, PVD, ALD, sputtering, etc.

At completion of the process step S420, the staircase structure 657 can be formed in the staircase region 210, which can be used to form electrical contacts to word lines in subsequent processes.

Referring to FIG. 4, at process step S425, channel holes can be formed in the channel structure region. A memory film and a channel layer can be disposed on a sidewall of each channel hole. A cross-sectional view of an exemplary 3D memory structure 700 is shown in FIG. 7, according to the process step S425.

Figure 7:
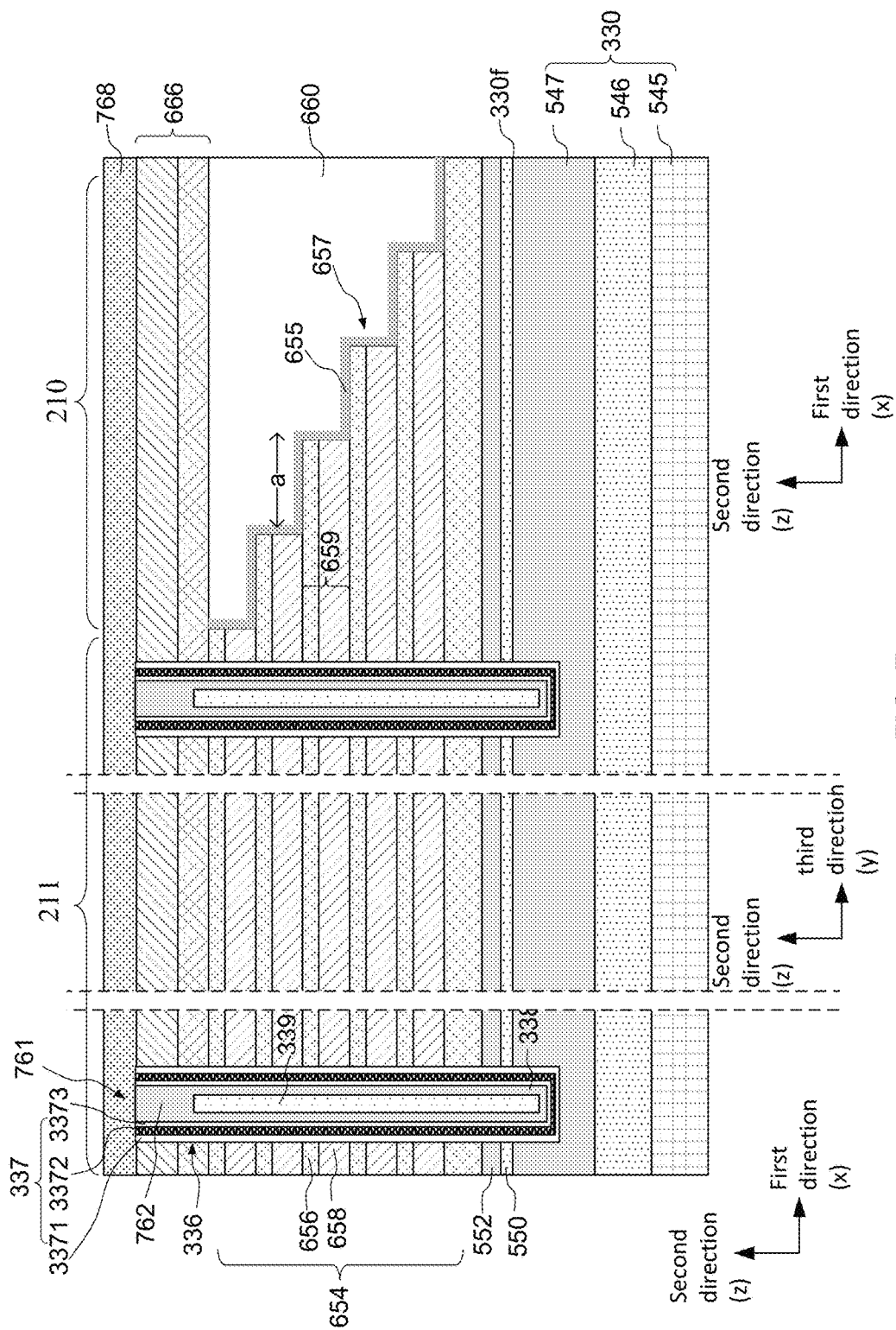

As shown in FIG. 7, the 3D memory structure 700 includes channel holes 336 formed in the channel structure region 211. The channel holes 336 penetrate through the dielectric stack 654 in the second direction. In some embodiments, the channel holes 336 penetrate further through the second etch-stop layer 552 and the first etch-stop layer 550 and extend into the substrate 330, for example, into the first semiconductor layer 547.

Techniques used to form the channel holes 336 can include processes such as photolithography and etching. The etching process to form the channel holes 336 can also include a dry etching, a wet etching, or a combination thereof. In some embodiments, the dielectric stack 654 can be etched using an anisotropic etching such as a reactive ion etch (ME). In some embodiments, fluorine or chlorine based gases such as carbon-fluorine ($CF_4$), hexafluoroethane ($C_2F_6$), $CHF_3$, $C_3F_6$, $Cl_2$, $BCl_3$, etc., or any combination thereof, can be used. The methods and etchants to etch the first dielectric layer 656 and the second dielectric layers 658 should not be limited by the embodiments of the present disclosure. In some embodiments, the first semiconductor layer 547 can function as an etch-stop during the etching process for the channel holes 336 such that the channel holes 336 do not extend further into the insulator layer 546 and the handle wafer 545.

After forming the channel holes 336, the memory film 337 can be disposed on a sidewall of the channel hole 336. In some embodiments, the memory film 337 can also be disposed at a bottom of the channel hole 336. In some embodiments, the memory film 337 can be a composite layer including a tunneling layer 3373, a storage layer 3372 (also known as "charge trapping layer"), and a blocking layer 3371. In some embodiments, the tunneling layer 3373, the storage layer 3372, and the blocking layer 3371 are arranged along a direction from a center of the channel hole 336 toward the outer of the channel hole 336 in the above order. The tunneling layer 3373 can include silicon oxide, silicon nitride, or any combination thereof. The blocking layer 3371 can include silicon oxide, silicon nitride, high dielectric constant (high-k) dielectrics, or any combination thereof. The storage layer 3372 can include silicon nitride, silicon oxynitride, silicon, or any combination thereof. In some embodiments, the memory film 337 includes ONO dielectrics (e.g., the tunneling layer 3373 including silicon oxide, the storage layer 3372 including silicon nitride, and the blocking layer 3371 including silicon oxide). The memory film 337 can be formed by using a thin film deposition process, such as ALD, CVD, PVD, sputtering or any other suitable process. In some embodiments, a thickness of the memory film 337 can be in a range from about 10 nm to about 50 nm.

Next, the channel layer 338 and the core filler 339 can be disposed in the channel holes 336, where the channel layer 338 covers a sidewall of the memory film 337 inside the channel hole 336. In some embodiments, the channel layer 338 can also be disposed at the bottom of the channel hole 336. The channel layer 338 can be any suitable semiconductor material such as silicon. In some embodiments, the channel layer 338 can be amorphous, polysilicon, or single crystalline silicon. The channel layer 338 can be formed by any suitable thin film deposition processes including, but not limited to, CVD, PVD, ALD, sputtering, evaporation, or a combination thereof. In some embodiments, a thickness of the channel layer 338 can be in a range from about 10 nm to about 30 nm.

In some embodiments, the core filler 339 can be disposed to fill the channel holes 336 to form a channel structure 761. The core filler 339 can be any suitable insulator, for example, silicon oxide, silicon nitride, silicon oxynitride, spin-on-glass, boron or phosphorus doped silicon oxide, carbon-doped oxide (CDO or SiOC or SiOC:H), fluorine doped oxide (SiOF), or any combination thereof. The core filler 339 can be deposited by using, for example, ALD, PVD, CVD, spin-coating, sputtering, or any other suitable film deposition techniques. The core filler 339 can also be formed by using repeated deposition and etch-back processes. The etch-back process can include, but not limited to, a wet etching, a dry etching, or a combination thereof. In some embodiments, one or more seams or gaps can be formed in the core filler 339 to reduce mechanical stress.

In some embodiments, the 3D memory structure 700 also includes a channel top plug 762 at a top portion of the channel structure 761. The channel top plug 762 can form electrical contact with the channel layer 338 inside the channel hole 336. The channel top plug 762 can be amorphous or polycrystalline silicon, and can include metal, metal alloy and/or metal silicide, for example, tungsten, titanium, tantalum, tungsten nitride, titanium nitride, tantalum nitride, nickel silicide, cobalt silicide, tungsten silicide, titanium silicide, or a combination thereof. The channel top plug 762 can be formed by a recess etching process followed by thin film deposition. The recess etching process includes wet etch, dry etch or a combination thereof. The thin film deposition includes CVD, PVD, ALD, sputtering, or any other suitable processes.

In some embodiments, the 3D memory device 700 can also include an epitaxial plug (not shown) at a bottom of the channel structure 761. The epitaxial plug can include any suitable semiconductor material, such as silicon, silicon germanium, germanium, gallium arsenide, gallium nitride, III-V compound, or any combination thereof. The epitaxial plug can be epitaxially grown from the substrate 330 (e.g., the first semiconductor layer 547). In some embodiments, the epitaxial plug can also include a polycrystalline semiconductor material, for example, polycrystalline silicon. In some embodiments, a portion of the memory film 337 at the bottom of the channel hole 336 can be removed such that the channel layer 338 can directly contact with the epitaxial plug.

It is noted that the number and arrangement of the channel structure 761 in the channel structure region 211 can be designed according to actual storage requirements, and are not limited to the example shown in FIG. 7. As discussed previously with respect to FIG. 2, the channel structure region 211 provides the storage function for the three-dimensional memory.

In some embodiments, a second capping layer 768 can be disposed on the first capping layer 666 to cover the channel structure 761. The second capping layer 768 can include silicon oxide, silicon nitride, silicon oxynitride, TEOS, or a combination thereof. The second capping layer 768 can be deposited by CVD, PVD, ALD, sputtering, etc.

Referring to FIG. 4, at process step S430, a gate line slit (GLS) opening can be formed in the dielectric stack. At process step S435, the second dielectric layers in the dielectric stack can be replaced with conductive layers to form the film stack of alternating conductive and dielectric layers. A cross-sectional view of an exemplary 3D memory structure 800 is shown in FIG. 8, according to the process step S430-S435.

Figure 8:
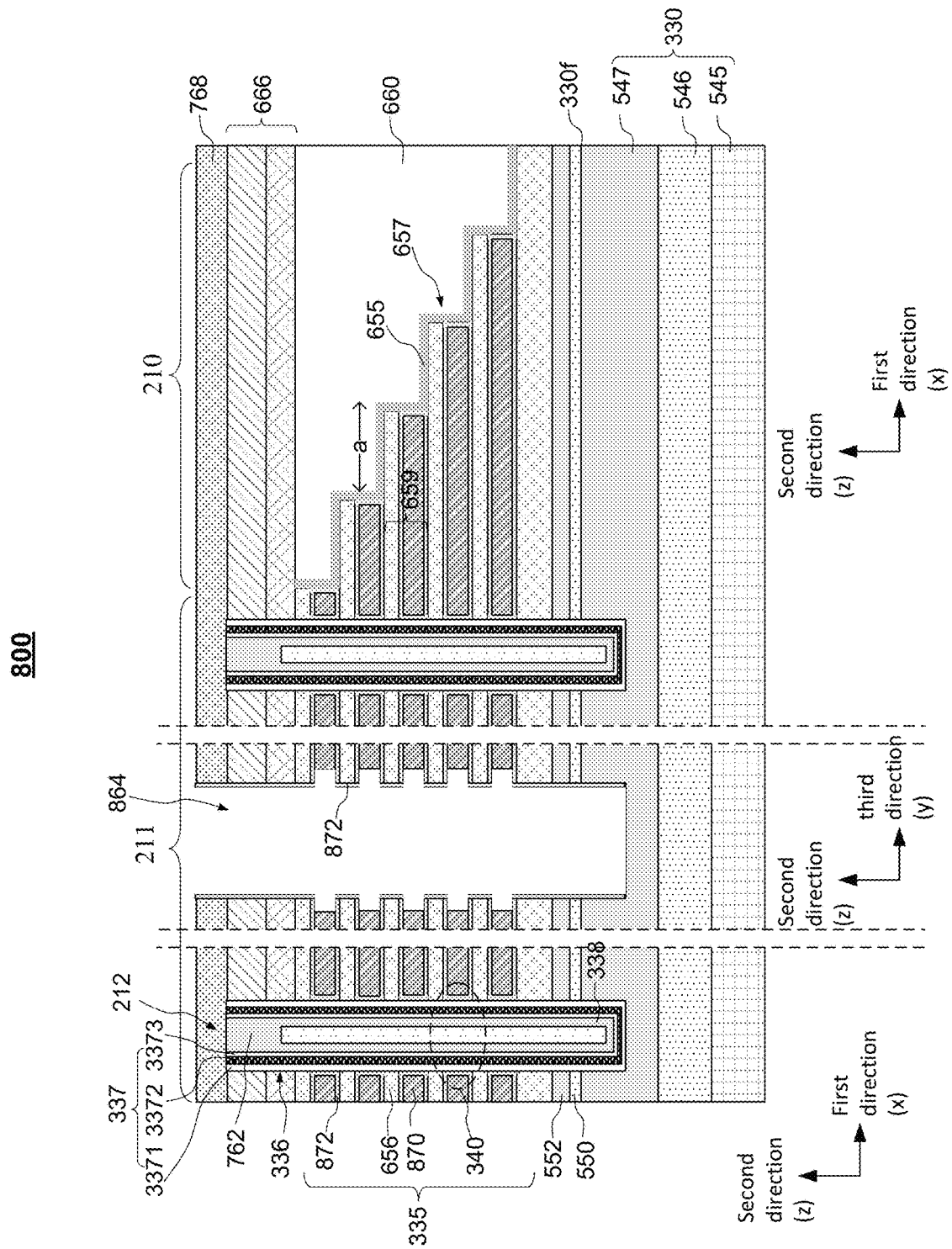

As shown in FIG. 8, the 3D memory structure 800 includes a gate line slit (GLS) opening 864 formed in the dielectric stack 654. The GLS opening 864 penetrates through the dielectric stack 654 in the second direction. In some embodiments, the GLS opening 864 also penetrates through the second etch-stop layer 552 and the first etch-stop layer 550, and further extends into the substrate 330 (e.g., into the first semiconductor layer 547). The GLS opening 864 can be formed by a lithography process and an etching process. The etching process can include any suitable dry etching, wet etching and/or a combination thereof. In the subsequent processes, the GLS opening 864 can be used to form the slit structure 216 as illustrated in FIG. 2. As noted previously, the cross-sectional view in FIG. 8 is drawn along the line AA' in FIG. 2. It should be understood that the GLS opening 864 (used to form the slit structure or the GLS 216 in the subsequent process steps) extends parallel to the staircase structure 657 in the WL-direction (or the first direction). The cross-sectional view of the GLS opening 864 is along a third direction (or a y-direction) perpendicular to the first direction. See also FIG. 3 of the configuration of the staircase structure and the slit structure 216.

At process step S435, the second dielectric layers 658 (in FIG. 7) in the dielectric stack 654 and the staircase structure 657 can be removed through the GLS opening 864 to form lateral tunnels. The lateral tunnels can extend in the first direction and the third direction between adjacent first dielectric layers 656. It is noted that, the term "lateral/laterally" used herein means the plane parallel to the top surface 330f of the substrate 330. The second dielectric layers 658 in the dielectric stack 654 are also referred to as sacrificial layers, and can be removed selectively from between the first dielectric layers 656. In the other words, the etching process of the second dielectric layers 658 can have minimal impact on the first dielectric layers 656. The second dielectric layers 658 can be removed by an isotropic dry etch and/or wet etch. The plasma and/or chemical used in the dry/wet etch can travel vertically and laterally from the GLS opening 864. In some embodiments, the second dielectric layer 658 can be silicon nitride, and the first dielectric layer 656 can be silicon oxide. In this example, the second dielectric layer 658 can be removed by RIE using one or more etchants of $CF_4$, $CHF_3$, $C_4F_8$, $C_4F_6$, and $CH_2F_2$, etc. In some embodiments, the second dielectric layer 658 can be removed using wet etch, such as phosphoric acid.

Next, conductive layers 870 can be disposed inside the lateral tunnels through the GLS opening 864. The conductive layers 870 can be disposed in between adjacent first dielectric layers 656, where the conductive layers 870 and the first dielectric layers 656 can form the film stack 335 of alternating conductive and dielectric layers (as in FIG. 3).

In some embodiments, the conductive layers 870 can be formed by filling the lateral tunnels with a suitable conductive material. The conductive material for the conductive layers 870 can include metal or metal alloys such as tungsten (W), aluminum (Al), titanium (Ti), copper (Cu), cobalt (Co), nickel (Ni), titanium nitride (TiN), tungsten nitride (WN), tantalum (Ta), tantalum nitride (TaN), AlTi, or any combination thereof. In some embodiments, the conductive material for the conductive layers 870 can also include poly-crystalline semiconductors, such as poly-crystalline silicon, poly-crystalline germanium, poly-crystalline germanium-silicon and any other suitable material, and/or combinations thereof. In some embodiments, the poly-crystalline material can be incorporated with any suitable types of dopant, such as boron, phosphorous, arsenic, or any combination thereof. In some embodiments, the conductive layers 870 can also be amorphous semiconductors such as amorphous silicon. In some embodiments, the conductive material can be disposed using a suitable deposition method such as chemical vapor deposition (CVD) (e.g., LPCVD, PECVD, MOCVD, RTCVD, etc.), physical vapor deposition (PVD), sputtering, evaporation, atomic layer deposition (ALD), or any combination thereof. In some embodiments, the conductive layers 870 include tungsten (W) deposited by CVD.

As described above, by replacing the second dielectric layers 658 with the conductive layers 870, the dielectric stack 654 turns into the film stack 335 of alternating conductive and dielectric layers. Accordingly, the channel structures 761 formed in the dielectric stack 654 become the memory strings 212, where the intersessions of the memory strings 212 and the film stack 335 form the vertically stacked memory cells 340. It should be understood that although the film stack 335 here is formed by a replacement method (i.e., replacing the second dielectric layers 658 with conductive layers 870), the film stack 335 can also be formed by other approaches, for example, by disposing the conductive layers 870 and the first dielectric layers 656 directly over the substrate 330.

In some embodiments, a gate dielectric layer 872 can be disposed inside the lateral tunnels, prior to disposing the conductive layers 870. The gate dielectric layer 872 can include any suitable insulator, for example, silicon oxide, silicon nitride, silicon oxynitride, and/or any suitable combinations thereof. The gate dielectric layer 872 can also include high-k dielectric materials, such as hafnium oxide, zirconium oxide, aluminum oxide, tantalum oxide, lanthanum oxide, and/or any combination thereof. The gate dielectric layer 872 can be disposed by one or more suitable deposition processes, such as CVD, PVD, and/or ALD.

In some embodiments, a gate adhesion layer (not shown in FIG. 8) can be disposed on the gate dielectric layer 872, prior to disposing the conductive layers 870. The gate adhesion layer can be used to promote adhesion between the gate dielectric layer 872 and the conductive layers 870. The gate adhesion layer can include, for example, tantalum nitride (TaN) and/or titanium nitride (TiN).

In some embodiments, etching and cleaning processes can be used to remove excess conductive materials on sidewalls of the GLS opening 864. As such, conductive layers 870 of the film stack 335 can be electrically isolated from each other. In some embodiments, the conductive layers 870 can be recessed back from sidewalls of the GLS opening 864 in the first direction. In some embodiments, excess conductive materials on top of the second capping layer 768 can also be removed, for example, by CMP.

In some embodiments, a portion of the gate dielectric layer 872 that is disposed on a bottom of the GLS opening 864 can be removed to expose the substrate 330 (e.g., the first semiconductor layer 547).

Referring to FIG. 4, at process step S440, a first GLS isolation layer can be disposed inside the GLS opening. Cross-sectional views of exemplary 3D memory structures 900 and 1000 are shown in FIGS. 9 and 10, according to the process step S440.

Figure 9:
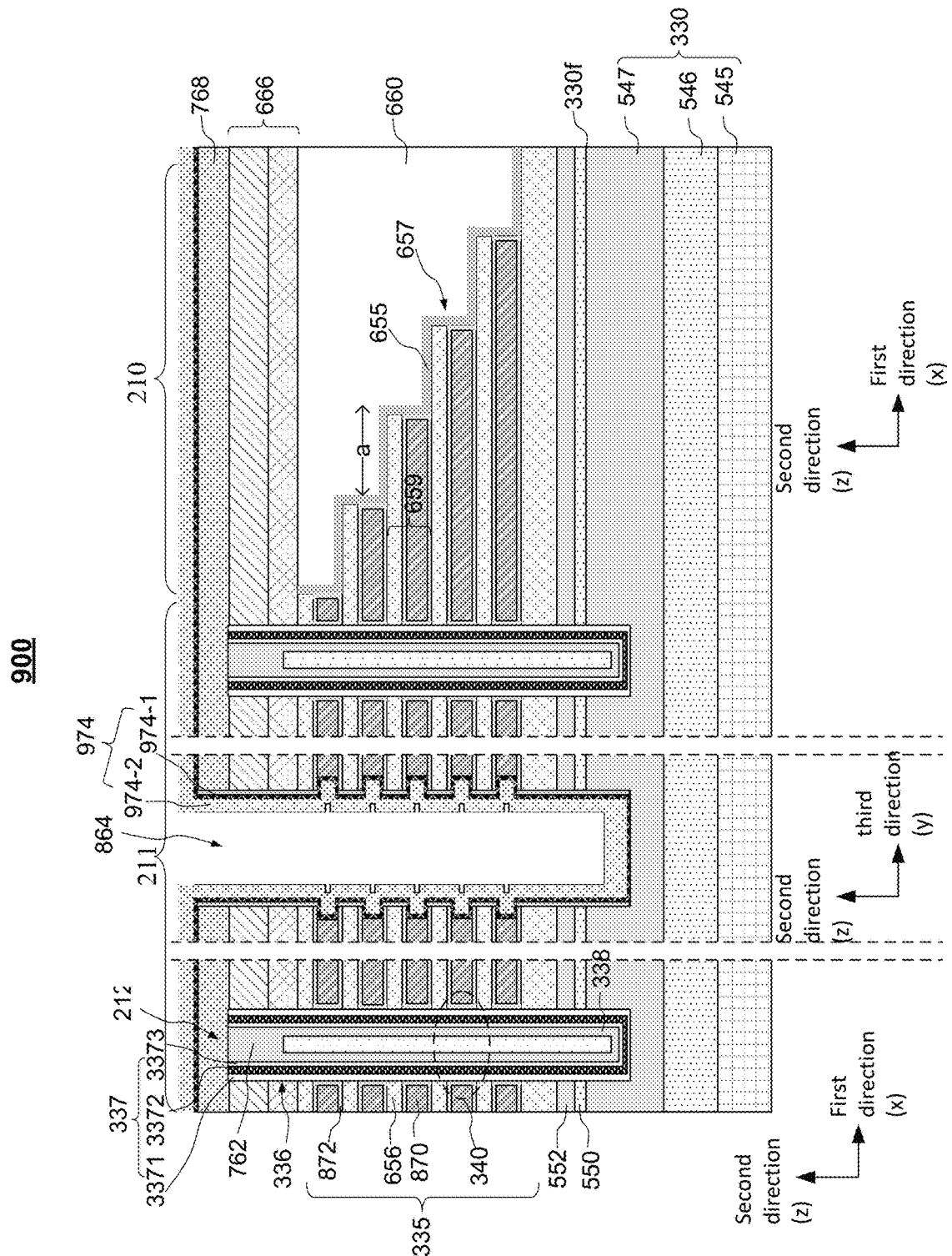
Figure 10:
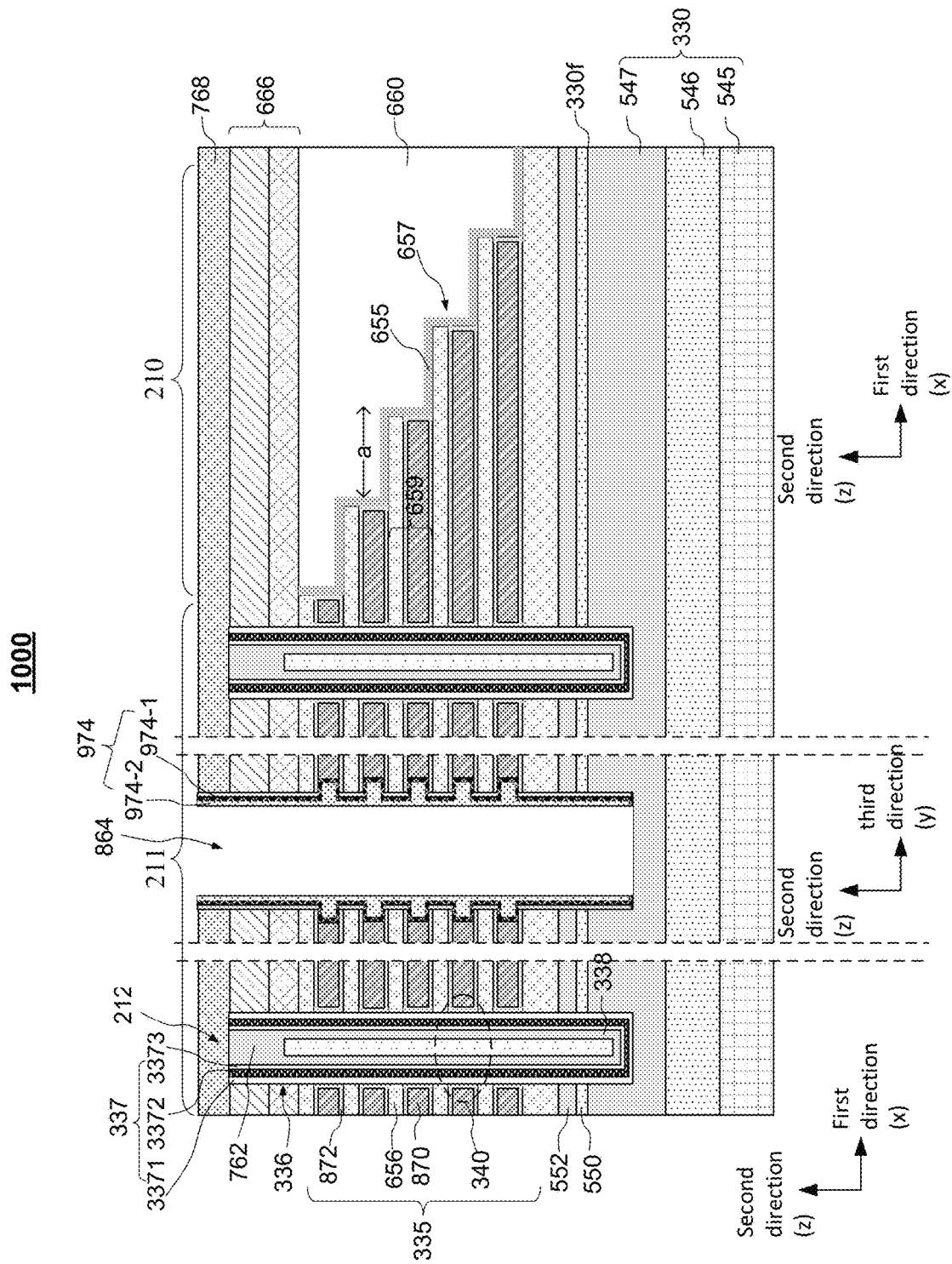

As shown in FIG. 9, a first GLS isolation layer (also referred to as a first isolation layer) 974 can be disposed to cover a sidewall of the GLS opening 864. In some embodiments, the first GLS isolation layer 974 includes a first sub-layer insulator 974-1 and a second sub-layer insulator 974-2, disposed sequentially inside the GLS opening 864. The first sub-layer insulator 974-1 can be disposed by, for example, ALD at a lower temperature, for example, not above 70° C., which can prevent the conductive layer 870 being oxidized. The second sub-layer insulator 974-2 can be disposed on the first sub-layer insulator 974-1 at a higher temperature, for example, in a range about 300° C. to about 600° C. The second sub-layer insulator 974-2 can be deposited by ALD, CVD, PVD, sputtering, or any other suitable method. In some embodiments, at least one of the first sub-layer insulator 974-1 and the second sub-layer insulator 974-2 can be conformal to underlying structures. The first sub-layer insulator 974-1 and the second sub-layer insulator 974-2 can include any suitable insulating material, for example, silicon oxide, silicon nitride, silicon oxynitride, and/or any suitable combinations thereof. The first sub-layer insulator 974-1 and the second sub-layer insulator 974-2 can include the same insulating material. The first sub-layer insulator 974-1 and the second sub-layer insulator 974-2 can also include a different insulating material. In some embodiments, the first sub-layer insulator 974-1 and the second sub-layer insulator 974-2 can include silicon oxide.

Next, a portion of the second sub-layer insulator 974-2 disposed on a sidewall of the GLS opening 864 can be smoothed or reshaped by a dry or wet etch process. In some embodiments, a portion of the first sub-layer insulator 974-1 and the second sub-layer insulator 974-2 can be removed from the bottom of the GLS opening 864 to expose a portion of the substrate 330 (e.g., the first semiconductor layer 547) inside the GLS opening 864. The resulting structure is shown in FIG. 10. In some embodiments, a portion of the first sub-layer insulator 974-1 and the second sub-layer insulator 974-2 outside the GLS opening 864, i.e., located on the second capping layer 768, can also be removed. In some embodiments, a portion of the second sub-layer insulator 974-2 on the sidewall of the GLS opening 864 can be thinned down during the process step S440.

Referring to FIG. 4, at process step S445, a second GLS isolation layer can be disposed inside the GLS opening. A cross-sectional view of an exemplary 3D memory structure 1100 is shown in FIG. 11, according to the process step S445.

Figure 11:
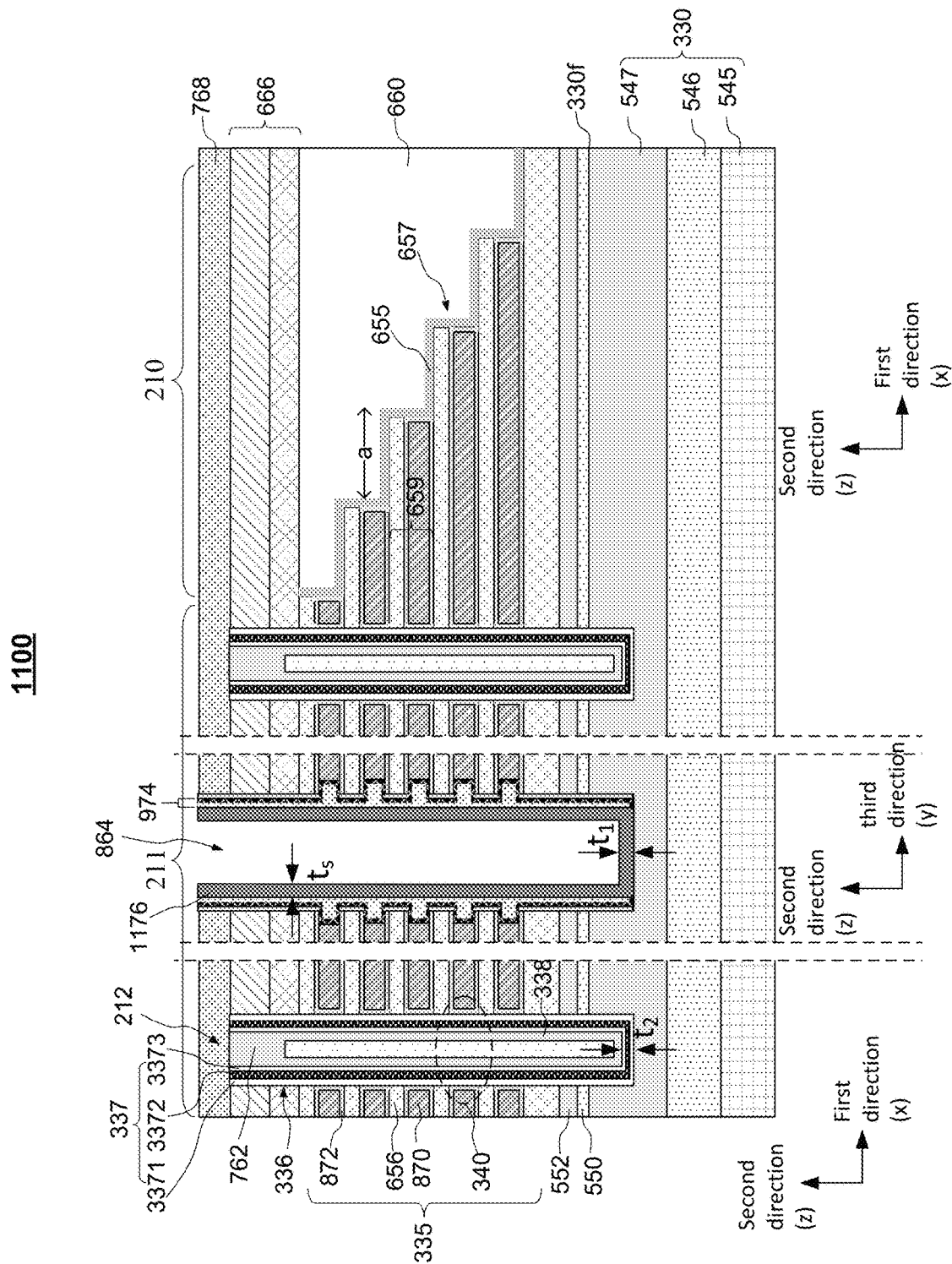

As shown in FIG. 11, a second GLS isolation layer 1176 (also referred to as a GLS isolation layer or a second isolation layer) can be disposed on a sidewall of the first GLS isolation layer 974 and on the bottom of GLS opening 864. The second GLS isolation layer 1176 can be disposed at a higher temperature, for example, above about 500° C. The second GLS isolation layer 1176 can be deposited by ALD, CVD, PVD, sputtering, or any other suitable method. A thickness of the second GLS isolation layer 1176 can be determined by the deposition time. The second GLS isolation layer 1176 can include any suitable insulator, for example, silicon oxide, silicon nitride, silicon oxynitride, and/or any suitable combinations thereof. In some embodiments, the second GLS isolation layer 1176 can include a different insulating material than the first GLS isolation layer 974. In some embodiments, the second GLS isolation layer 1176 can include the same insulating material as the first GLS isolation layer 974. In some embodiments, the second GLS isolation layer 1176 includes silicon oxide.

In some embodiments, the second GLS isolation layer 1176 includes the same material as the memory film 337. For example, the second GLS isolation layer 1176 can have a composite structure, including silicon oxide/silicon nitride/silicon oxide layers. In this example, the second GLS isolation layer 1176 can have a thickness "$t_1$" at the bottom of the GLS opening 864 to be about the same as a thickness "$t_2$" of the memory film 337 at the bottom of the channel hole 336 such that the second GLS isolation layer 1176 and the memory film 337 can be removed simultaneously in the subsequent process. In some embodiments, the second GLS isolation layer 1176 and the memory film 337 can include a different material. In this example, the thickness "$t_1$" of the second GLS isolation layer 1176 can be determined by etch-rates of the second GLS isolation layer 1176 and the memory film 337 such that the second GLS isolating layer 1176 and the memory film 337 can be removed simultaneously in the subsequent process.

In some embodiments, the second GLS isolation layer 1176 can include a thickness "$t_s$" on the sidewall of the GLS opening 864. The thickness "$t_s$" of the second GLS isolation layer 1176 can be adjusted such that the second GLS isolation layer 1176 can provide sufficient electrical isolation for the conductive layers 870.

Referring to FIG. 4, at process step S450, a GLS filler can be disposed inside the GLS opening. A cross-sectional view of an exemplary 3D memory structure 1200 is shown in FIG. 12, according to the process step S450.

Figure 12:
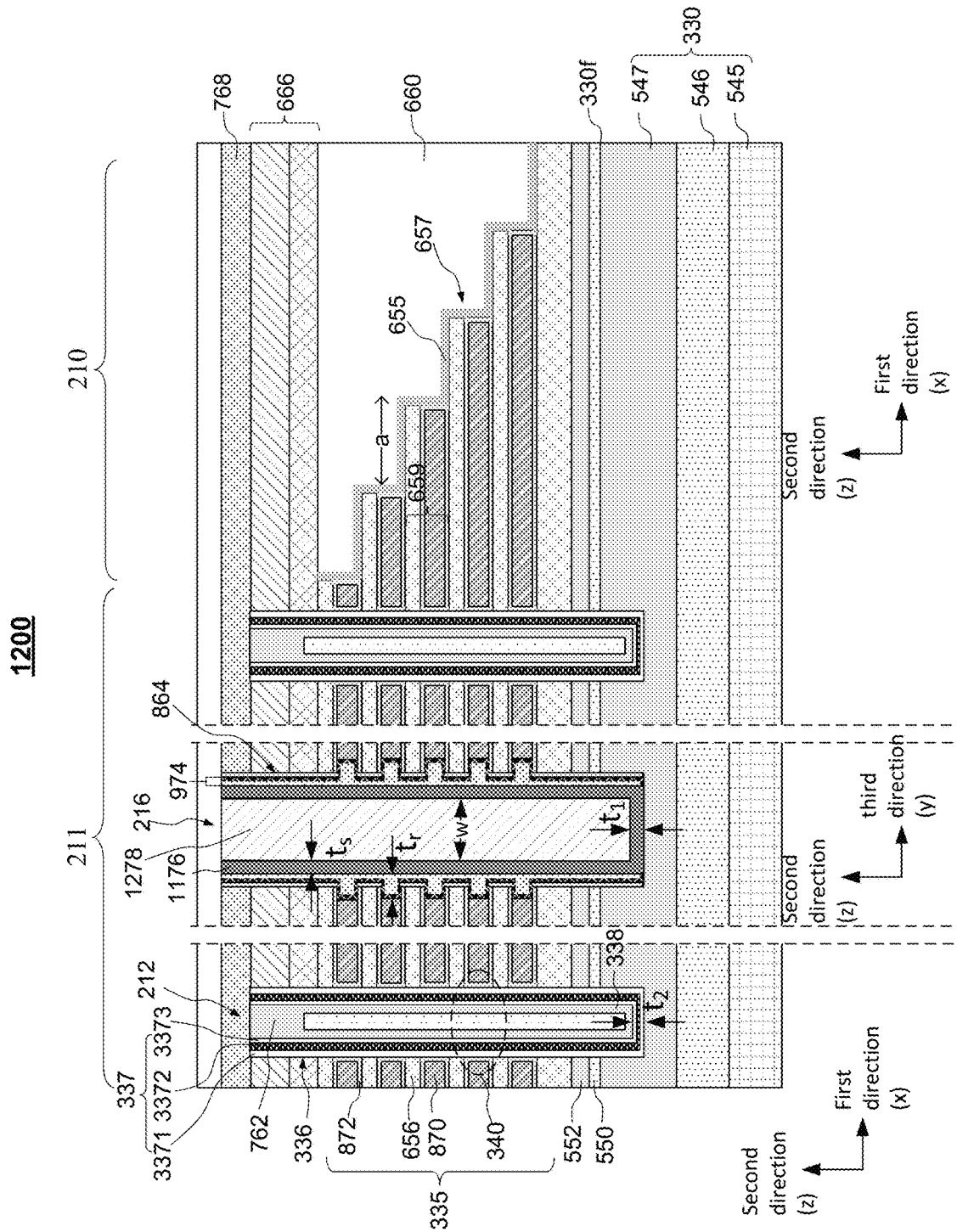

As shown in FIG. 12, a GLS filler 1278 can be disposed inside the GLS opening 864 (see FIG. 11) to form the slit structure (also referred to as GLS) 216, as shown in FIGS. 2 and 3. In the second direction, the GLS 216 penetrates through the film stack 335 of alternating conductive and dielectric layers and extends into the substrate 330. The GLS filler 1278 can include metal or metal alloys such as tungsten (W), aluminum (Al), titanium (Ti), copper (Cu), cobalt (Co), nickel (Ni), titanium nitride (TiN), tungsten nitride (WN), tantalum (Ta), tantalum nitride (TaN), AlTi, or any combination thereof. In some embodiments, the GLS filler 1278 can also include poly-crystalline semiconductors, such as poly-crystalline silicon, poly-crystalline germanium, poly-crystalline germanium-silicon and any other suitable material, and/or combinations thereof. In some embodiments, the poly-crystalline material can be incorporated with any suitable n-type or p-type of dopants, such as boron, phosphorous, arsenic, or any combination thereof. In some embodiments, the GLS filler 1278 can also include amorphous semiconductors such as amorphous silicon. In some embodiments, the GLS filler 1278 can also include metal silicide, such as $WSi_x$, $CoSi_x$, $NiSi_x$, $TiSi_x$, or $AlSi_x$, etc. In some embodiments, the GLS filler 1278 can include any combination of the conductive material aforementioned. The GLS filler 1278 can be disposed using any suitable deposition method such as CVD (e.g., LPCVD, RTCVD, PECVD, etc.), PVD, ALD, sputtering, evaporation, or any combination thereof. In some embodiments, the GLS filler 1278 includes polycrystalline silicon deposited by CVD.

As discussed previously with respect to FIGS. 2 and 3, the GLS 216 can divide a memory block into multiple sub-storage units. For example, the GLS 216 can extend laterally along the WL-direction across the channel structure region 211 and the staircase region 210 to divide the memory block 103 (as shown in the region 108 in FIG. 2) into memory fingers 218.

Therefore, thicknesses of the first GLS isolation layer 974 and the second GLS isolation layer 1176 can be adjusted to minimize leakage between the conductive layers 870 and the GLS filler 1278. Specifically, the thickness "$t_s$" of the second GLS isolation layer 1176 and/or a thickness "$t_r$" of the first GLS isolation layer 974 on the sidewall of the GLS 216 can be adjusted to provide sufficient electrical isolation between the conductive layers 870 and the GLS filler 1278.

The GLS 216 can also provide mechanic support for the 3D memory structure 1200. The GLS filler 1278 can include a width "w" adjustable according to a stress level of the substrate 330.

In some embodiments, a planarization process can be performed after the deposition of the GLS filler 1278 to form a coplanar surface between the GLS 216 and the second capping layer 768. Excess conductive material of the GLS filler 1278 deposited outside of the GLS opening 864 (e.g., on top of the second capping layer 768) can be removed such that neighboring GLSs 216 can be electrically isolated from each other. The planarization process includes chemical mechanical polishing (CMP) or RIE etch-back. In some embodiments, a protection layer can be disposed on the second capping layer 768 to cover the GLS 216 from a front side of the film stack 335 (also referred to as a first side of the film stack 335, i.e., a side farther away from the substrate 330).

Referring to FIG. 4, at process step S455, the substrate can be removed to expose a portion of the first etch-stop layer, as well as portions of the memory film and the GLS that extend into the substrate. A cross-sectional view of an exemplary 3D memory structure 1300 is shown in FIG. 13, according to the process step S455.

Figure 13:
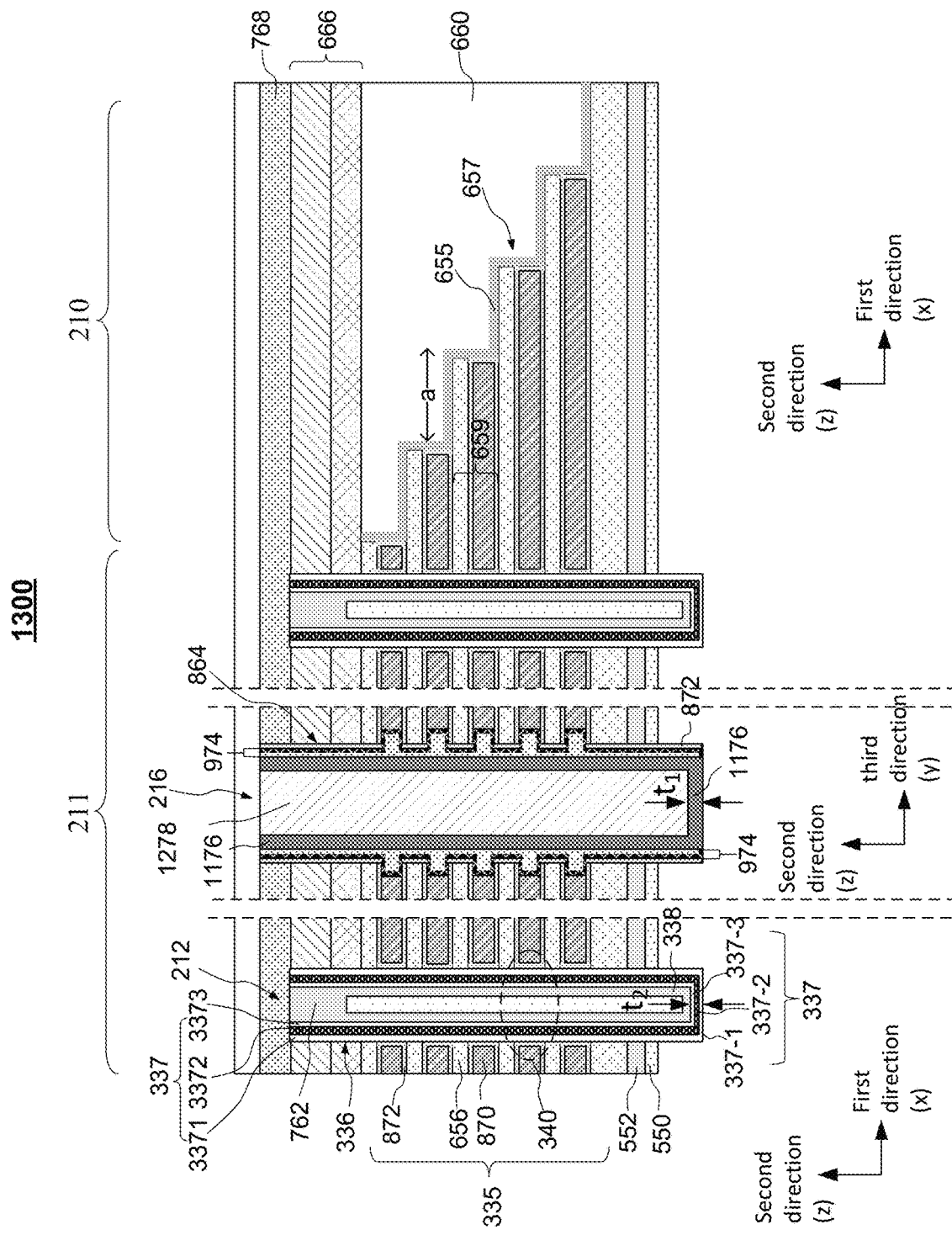

As shown in FIG. 13, the substrate 330 can be removed from a backside of the substrate 330 (also referred to as a second side of the substrate 330, i.e., a side farther away from the film stack 335, opposite to the front side of the film stack 335). In some embodiments, the handle wafer 545 of the substrate 330 can be removed first, by a process such as wafer grounding, CMP and/or dry/wet etching, stopping on the insulator layer 546. In the other words, the process of removing the handle wafer 545 can be selective to the insulator layer 546. For example, the etching rate of the handle wafer 545 can be much higher than the etching rate of the insulator layer 546. Next, the insulator layer 546 can be removed by, for example, a dry or wet etching process, stopping on the first semiconductor layer 547. In the other words, the process of removing the insulator layer 546 can be selective to the first semiconductor layer 547. For example, the etching rate of the insulator layer 546 can be much higher than the etching rate of the first semiconductor layer 547. Subsequently, the first semiconductor layer 547 can be removed by a dry or wet etching process, stopping on the first etch-stop layer 550. In the other words, the process of removing the first semiconductor layer 547 can be selective to the first etch-stop layer 550. For example, the etching rate of the first semiconductor layer 547 can be much higher than the etching rate of the first etch-stop layer 550.

In some embodiments, the process of removing the substrate 330 and/or removing the first semiconductor layer 547 can also be selective to the memory film 337 (e.g., the blocking layer 3371) of the memory string 212. For example, the etching rate of the first semiconductor layer 547 can be much higher than the etching rate of the memory film 337. Accordingly, a portion of the memory film 337 (e.g., blocking layer 3371) extending into the substrate 330 can be exposed after removing the substrate 330. The memory string 212 having the exposed portion of the memory film 337 protrudes out of the first etch-stop layer 550 from a backside of the film stack 335 (i.e., a side of the film stack 335 closer to the substrate 330 or the first etch-stop layer 550).

Similarly, the process of removing the substrate 330 and/or removing the first semiconductor layer 547 can also be selective to the second GLS isolation layer 1176 of the GLS 216. A portion of the second GLS isolation layer 1176 of the GLS 216, which is located at the bottom of the GLS 216 (or the bottom of the GLS opening 864) and extends into the substrate 330, can be exposed from the backside of the film stack 335 after removing the substrate 330. For example, the etching rate of the first semiconductor layer 547 can be much higher than the etching rate of the second GLS isolation layer 1176. The GLS 216 having the exposed portion of the second GLS isolation layer 1176 protrudes out of the first etch-stop layer 550 from the backside of the film stack 335. In the subsequent process, the exposed portion of the second GLS isolation layer 1176 can be removed to expose the GLS filler 1278. In one example, the exposed portion of the second GLS isolation layer 1176 can be any portion of the second GLS isolation layer 1176 that can be removed to exposed the GLS filler 1278 in the subsequent process.

In some embodiments, the process of removing the substrate 330 and/or removing the first semiconductor layer 547 can also be selective to the first GLS isolation layer 974 and/or the gate dielectric layer 872. For example, the etching rate of the first semiconductor layer 547 can be much higher than the etching rate of the first GLS isolation layer 974. A portion of the first GLS isolation layer 974, which extends into the substrate 330, can be exposed from the backside of the film stack 335. In another example, the etching rate of the first semiconductor layer 547 can be much higher than the etching rate of the gate dielectric layer 872. A portion of the gate dielectric layer 872, which extends into the substrate 330, can be exposed from the backside of the film stack 335. Accordingly, the first GLS isolation layer 974 and/or the gate dielectric layer 872 of the GLS 216 can also protrude out of the first etch-stop layer 550 from the backside of the film stack 335.

By adding etch-stop layers and using selective etching process, process uniformity for removing the substrate can be greatly improved.

Referring to FIG. 4, at process step S460, the first etch-stop layer, the exposed portion of the memory film and the exposed portion of the second GLS isolation layer can be removed to expose a portion of the channel layer and a portion of GLS filler, respectively. A cross-sectional view of an exemplary 3D memory structure 1400 is shown in FIG. 14, according to the process step S460.

Figure 14:
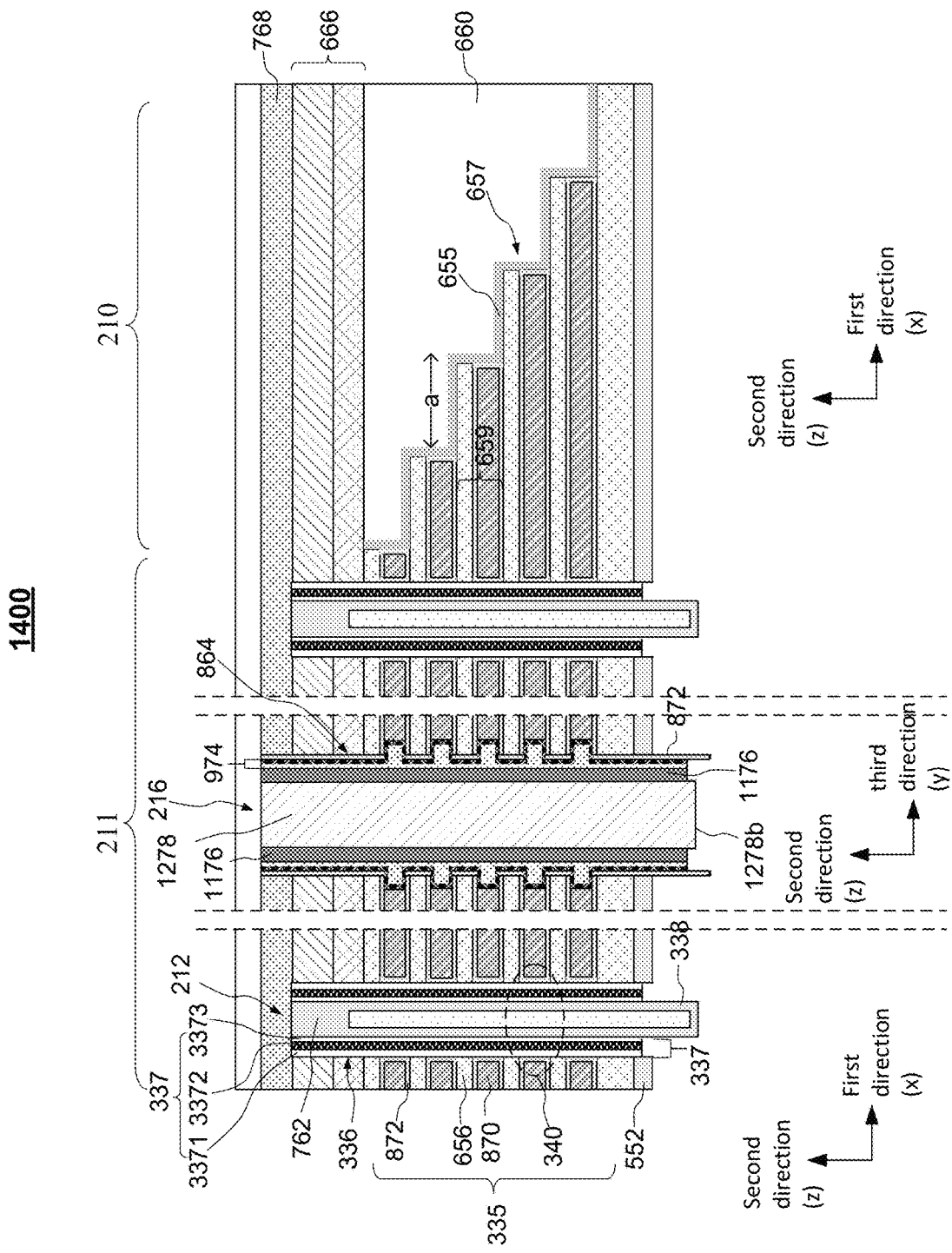

As shown in FIG. 14, the first etch-stop layer 550 can be removed from the 3D memory structure 1300 from the backside of the film stack 335 to form the 3D memory structure 1400. The first etch-stop layer 550 can be removed by, for example, a dry or wet etching process, where the etching process can be stopped at the second etch-stop layer 552. In the other words, the process of removing the first etch-stop layer 550 can be selective to the second etch-stop layer 552. For example, the etching rate of the first etch-stop layer 550 can be much higher than the etching rate of the second etch-stop layer 552.

In some embodiments, the etching process of the first etch-stop layer 550 can also remove the exposed portion of the memory film 337 (i.e., the portion extending into the substrate 330 in FIG. 12) and can also be selective to the channel layer 338 of the memory string 212. In the other words, the exposed portion of the memory film 337 can be removed stopping on the underlying channel layer 338. For example, the etching rate of the memory film 337 can be much higher than the etching rate of the channel layer 338. As such, a portion of the channel layer 338 of the memory string 212 can be exposed from the backside of the film stack 335. The exposed portion of the channel layer 338 protrudes out of the second etch-stop layer 552 from the backside of the film stack 335. In some embodiments, the memory film 337 can be further pulled back (or recessed) into the second etch-stop layer 552 or a bottommost first dielectric layer 656 (that is closest to the second etch-stop layer 552) such that the exposed portion of the channel layer 338 from the backside of the film stack 335 can have a larger surface area.

In some embodiments, the etching process of the first etch-stop layer 550 can also remove the exposed portion of the second GLS isolation layer 1176 (i.e., the portion located at the bottom of the GLS opening and extending into the substrate 330 in FIG. 12) and can also be selective to the GLS filler 1278 of the GLS 216. In the other words, the exposed portion of the second GLS isolation layer 1176 can be removed stopping on the underlying GLS filler 1278. For example, the etching rate of the second GLS isolation layer 1176 can be much higher than the etching rate of the GLS filler 1278. As such, a portion of the GLS filler 1278 of the GLS 216 can be exposed from the backside of the film stack 335. The exposed portion of the GLS filler 1278 protrudes out of the second etch-stop layer 552 from the backside of the film stack 335. In some embodiments, the second GLS isolation layer 1176 can be further pulled back (or recessed) from a back surface 1278b of the GLS filler 1278 such that the exposed portion of the GLS filler 1278 from the backside of the film stack 335 can have a larger surface area.

As discussed previously, the thickness of the second GLS isolation layer 1176 can be predetermined such that the exposed portion of the second GLS isolation layer 1176 can be removed simultaneously as the exposed portion of the memory film 337. Thicknesses of the exposed portions of the second GLS isolation layer 1176 and the memory film 337 can be about the same as the thicknesses "$t_1$" and "$t_2$" as described in FIG. 11. For example, the thickness "$t_1$" of the second GLS isolation layer 1176 (e.g., at the bottom of the GLS opening 864 in FIG. 11) can be determined based on an etch rate of the second GLS isolation layer 1176 with respect to an etch rate of the memory film 337. In some embodiments, the thickness "$t_1$" of the GLS isolation layer 1176 can be determined by a ratio of the etch rates between the second GLS isolation layer 1176 and the memory film 337. For example, when the second GLS isolation layer 1176 and the memory film 337 are made from the same material (e.g. silicon oxide/silicon nitride/silicon oxide), the second GLS isolation layer 1176 can have the thickness "$t_1$" about the same as the thickness "$t_2$" of the memory film 337 such that the exposed portions of the second GLS isolation layer 1176 and the memory film 337 can be removed simultaneously.

In some embodiments, the etching process of the first etch-stop layer 550 can also etch the exposed portion of the first GLS isolation layer 974 such that the first GLS isolation layer 974 can be pulled back (or recessed) from the back surface 1278b of the GLS filler 1278.

In some embodiments, the first etch-stop layer 550 can be removed with a higher selectivity with respect to the memory film 337 and/or the second GLS isolation layer 1176. For example, the etching rate of the first etch-stop layer 550 can be much higher than the etching rate of the memory film 337 and/or the second GLS isolation layer 1176. As such, an etch time used during the etching process at the process step S460 can be predominately determined by the etching of the memory film 337 and the second GLS isolation layer 1176 to ensure target thicknesses of the memory film 337 and the second GLS isolation layer 1176 can be etched. In one example, the etch time of the etching process at the process step S460 can be mainly determined by the removal of the exposed portion of memory film 337 and the exposed portion of the second GLS isolation layer 1176.

In some embodiments, the first etch-stop layer 550 can be removed with a higher selectivity with respect to the gate dielectric layer 872. For example, the etching rate of the first etch-stop layer 550 can be much higher than the gate dielectric layer 872.

In some embodiments, the exposed portions of the memory film 337 and the second GLS isolation layer 1176 can be removed selectively with respect to the gate dielectric layer 872. Namely, the etching process used at process step S460 is selective to the gate dielectric layer 872. For example, the etching rate of the memory film 337 and the second GLS isolation layer 1176 can be much higher than the gate dielectric layer 872. As such, the gate dielectric layer 872 can protrude out of the second GLS isolation layer 1176 at the backside of the film stack 335. Namely, the exposed portion of the gate dielectric layer 872 formed during the previous process step S455 is not removed. In this example, the exposed portion of the gate dielectric layer 872 prevents the first GLS isolation layer 974 and the second GLS isolation layer 1176 from being etched in a lateral direction (e.g., the first direction) parallel to the film stack 335. Accordingly, portions of the gate dielectric layer 872, first and second GLS isolation layers 974/1176 and the GLS filler 1278 can protrude from the second etch-stop layer 552 on the backside of the film stack 335 (as shown in FIG. 14).

In some embodiments, the exposed portion of the gate dielectric layer 872 can be removed, for example, by an isotropic etching process. In this example, portions of the first GLS isolation layer 974 and the second GLS isolation layer 1176 that extend into substrate 330 (as shown FIG. 12) can also be removed at the process step S460. In some embodiments, the gate dielectric layer 872, the first GLS isolation layer 974 and the second GLS isolation layer 1176 can be further pulled back (or recessed) into the second etch-stop layer 552 or the bottommost first dielectric layer 656.

To summarize, by implementing the second etch-stop layer 552, the exposed portion of the memory film 337 and the exposed portion of the second GLS isolation layer 1176 can be removed controllably from the backside of the film stack 335 without affecting the underlying film stack 335. Uniformity of the exposed portion of the channel layer 338 and the exposed portion of the GLS filler 1278 can also be improved. By controllably recessing the memory film 337 below the second etch-stop layer 552 (or into the film stack 335), the exposed portion of the channel layer 338 can be controlled. Similarly, by controllably recessing the second GLS isolation layer 1176 from the back surface 1278b of the GLS filler 1278, the exposed portion of the GLS filler 1278 can be controlled.

Referring to FIG. 4, at process step S465, an array common source (ACS) can be disposed on the exposed portion of the channel layer and the exposed portion of the GLS filler from the backside of the film stack of alternating conductive and dielectric layers. A cross-sectional view of an exemplary 3D memory structure 1500 is shown in FIG. 15, according to the process step S465.

Figure 15:
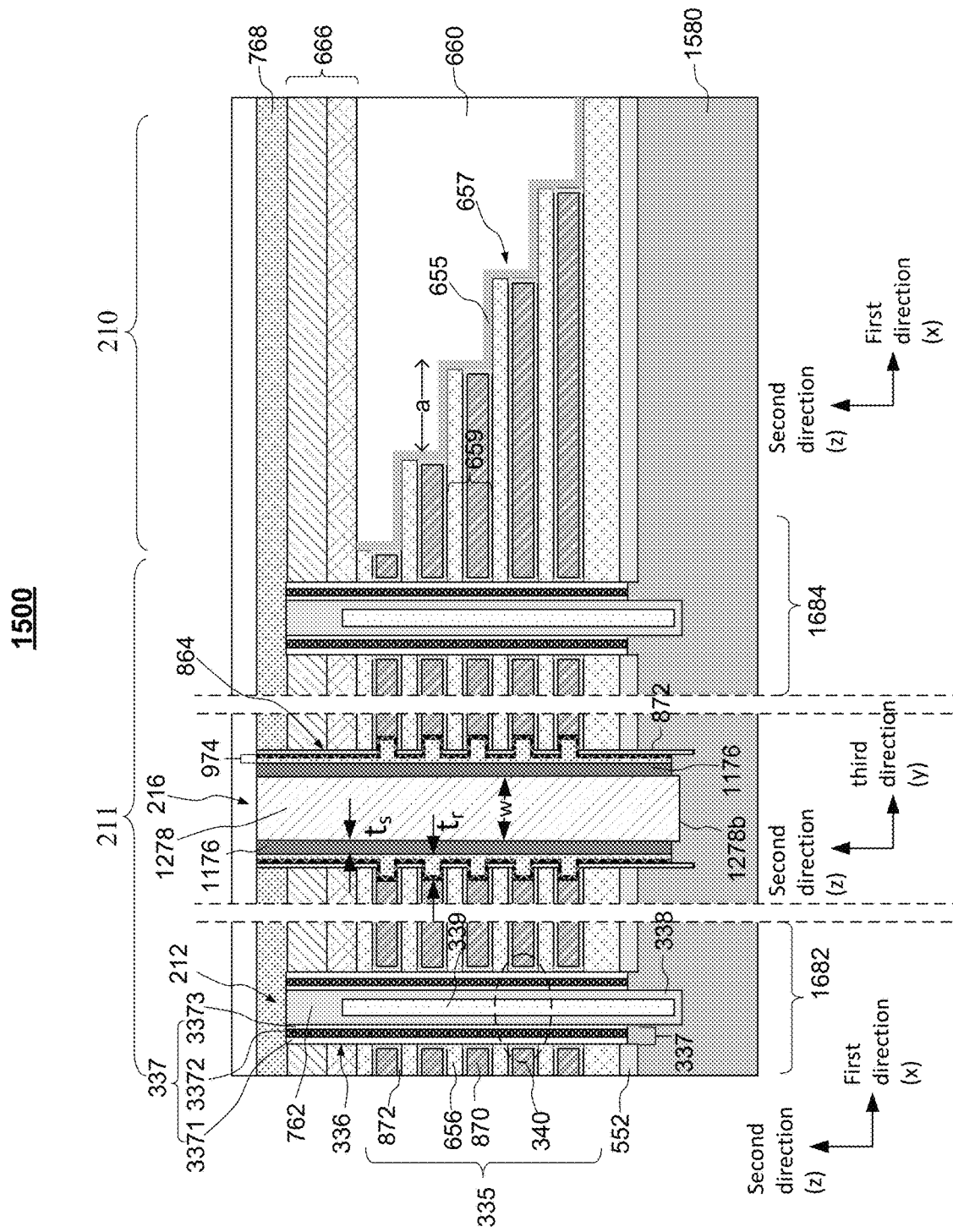

As shown in FIG. 15, the 3D memory structure 1500 includes a second semiconductor layer 1580 disposed on a backside of the second etch-stop layer 552, where the backside of the second etch-stop layer 552 is a side farther away from the film stack 335. In some embodiments, the second semiconductor layer 1580 can be an array common source (ACS) and can also be referred to as the ACS 1580. In some embodiments, the ACS 1580 includes one or more polycrystalline silicon layers.

In some embodiments, the ACS 1580 includes one or more polycrystalline silicon layers. A thin film deposition process such as CVD, PVD, ALD, sputtering, evaporation, or any combination thereof can be used to deposit the one or more polycrystalline silicon layers on the backside of the second etch-stop layer 552, covering exposed portions of the memory string 212 and the GLS 216. The one or more polycrystalline silicon layers can be doped with p-type or n-type dopants using, for example, an ion implantation process, followed by an annealing process (e.g., laser anneal, rapid thermal anneal, etc.) to activate the dopants and reduce defects caused by the ion implantation process. In some embodiments, the ACS 1580 can include one or more polycrystalline silicon layers in-situ doped during deposition (e.g., CVD, PVD, ALD, etc.).

In the 3D memory structure 1500, the ACS 1580 can contact the exposed portion of the channel layer 338, and thereby can provide electrical connections to the channel layer 338 of the memory string 212. The ACS 1580 can directly or indirectly contact the exposed portion of the channel layer 338, i.e., there can be another layer or film in between the ACS 1580 and the exposed portion of the channel layer 338. As discussed previously, the surface area of the exposed portion of the channel layer 338 can be increased by recessing the memory film 337. Thus, the contact area between the ACS 1580 and the channel layer 338 can also be increased. As a result, contact resistance between the ACS 1580 and the channel layer 338 of the memory string 212 can be reduced and performance of the 3D memory can be improved. It is noted that the ACS 1580 can contact the channel layers 338 of memory strings 212 in the entire memory block. In some embodiments, the ACS 1580 can provide electrical connections to all the memory strings 212 in the same memory block 103 (see FIG. 1).

In some embodiments, the second etch-stop layer 552 can also be used as a spacer between the film stack 335 and the ACS 1580. By adjusting the thickness of the second etch-stop layer 552, the distance between the ACS 1580 and the conductive layers 870 (i.e., word lines 333 as in FIG. 3) can be effectively controlled.

In some embodiments, the ACS 1580 can contact the exposed portion of the GLS filler 1278 of the GLS 216. The ACS 1580 can directly or indirectly contact the exposed portion of the GLS filler 1278 of the GLS 216, i.e., there can be another layer in between the ACS 1580 and the exposed portion of the GLS filler 1278 of the GLS 216. As discussed previously, the surface area of the exposed portion of the GLS filler 1278 can be increased by recessing the second GLS isolation layer 1176. The contact area between the ACS 1580 and the GLS filler 1278 can also be increased. Therefore, contact resistance between the ACS 1580 and the GLS filler 1278 of the GLS 216 can be reduced and performance of the 3D NAND memory can be improved.

Through the ACS 1580, an electrical connection can be provided to the channel layer 338 of the memory string 212. Because the GLS filler 1278 is in contact with the ACS 1580 and can be electrically connected to the ACS 1580, the GLS filler 1278 can be electrically connected to the channel layers 338 of the memory strings 212. The width "w" of the GLS filler 1278 can be adjusted to provide minimum resistance and stress level.

As discussed previously, the GLS 216 can also divide the memory block 103 into sub-storage units (e.g., memory fingers 218 in FIG. 2) due to the electrical isolation provided by the second GLS isolation layer 1176 and/or the first GLS isolation layer 974 formed on the sidewall of the GLS 216. Thicknesses (i.e., "$t_s$" and "$t_r$") of the second GLS isolation layer 1176 and the first GLS isolation layer 974 on the sidewall of the GLS 216 can be adjusted to minimize leakage between the conductive layer 870 and the GLS filler 1278. As such, the conductive layer 870 can be separated by the GLS 216 into independently controllable word lines 333 (as seen in FIG. 3).

As the number of vertically stacked memory cells 340 is increased greatly to achieve high storage capacity, the thickness of the film stack 335 also increases. As a result, the aspect ratio of the memory string 212 and the GLS 216 is also increased. Forming electrical connections with the ACS 1580 from the front side of the film stack 335 (a side farther away from the substrate 330 in FIG. 12) is very challenging.

In one example, the memory film 337 at the bottom of the channel hole 336 needs to be removed in order to form an electrical connection between the ACS 1580 and the channel layer 338. However, removing the portion of the memory film 337 located at the bottom of the channel hole 336 with a high aspect ratio can cause damage to the memory film 337 deposited on the sidewall of the channel hole 336 and can result in high leakage of the memory cells 340. Likewise, the second GLS isolation layer 1176 at the bottom of the GLS opening 864 needs to be removed in order to form an electrical connection between the ACS 1580 and the GLS filler 1278. However, removing the portion of the second GLS isolation layer 1176 located at the bottom of the GLS opening 864 with a high aspect ratio can cause damage to the second GLS isolation layer 1176 and/or the first GLS isolation layer 974 that are deposited on the sidewall of the GLS opening 864 and can result in high leakage between the GLS 216 and the conductive layer 870.

By removing the substrate 330 and providing electrical contacts for the channel layer 338 and the GLS filler 1278 from the backside of the film stack 335, etch process in the channel hole 336 and the GLS opening 864 that have high aspect ratios can be avoided. Additionally, by adjusting the thickness of the second GLS isolation layer 1176, the memory film 337 and the second GLS isolation layer 1176 can be removed controllably (or simultaneously) from the backside of the film stack 335. Process uniformity and yield can be greatly improved.

In summary, through removing the substrate 330 and forming the ACS 1580 on the backside of the film stack 335, process complexity can be reduced and target contact resistances can be achieved between the ACS 1580 and the channel layer 388 of the memory string, as well as between the ACS 1580 and the GLS filler 1278 of the GLS 216.

The present disclosure also provides a 3D memory device fabricated using the methods discussed above.

FIG. 15 illustrates a 3D memory device 1500, according to some embodiments of the present disclosure. The 3D memory device 1500 includes the film stack 335 of alternating conductive and dielectric layers.

The film stack 335 includes the conductive layers 870 and the first dielectric layers (also referred to as dielectric layers) 656 alternatingly stacked in a vertical direction (or the second direction). The film stack 335 extends in a lateral direction (i.e., the third direction and/or the first direction) perpendicular to the second direction.

In some embodiments, the film stack 335 can include layers in addition to the first dielectric layer 656 and the conductive layers 870, and can be made of different materials and/or with different thicknesses.

The film stack 335 can also include the gate dielectric layer 872 surrounding the conductive layer 870. In the second direction, the gate dielectric layer 872 can be sandwiched between the conductive layer 870 and the first dielectric layer 656. In the first direction, the gate dielectric layer 872 can be sandwiched between the memory film 337 and the conductive layer 870.

In some embodiments, the film stack 335 can also include a gate adhesion layer (not shown in FIG. 15) sandwiched in between the gate dielectric layers 872 and the conductive layers 870. The gate adhesion layer can be used to promote adhesion between the gate dielectric layer 872 and the conductive layers 870.

The 3D memory device 1500 also includes the staircase structure 657, formed in the film stack 335 in the staircase region 210. The staircase structure 657 includes staircase steps 659. The staircase step 659, or a "staircase layer", refers to a layer stack with the same lateral dimension, parallel to the conductive layers 870 and the first dielectric layers 656. Each of the staircase steps 659 terminates at a shorter length than the staircase step underneath in the first direction. In the other words, staircase steps 659 closer to the backside of the film stack 335 is longer and staircase steps 659 closer to the front side of the film stack 335 is shorter. An upper staircase step farther away from the backside of the film stack 335 is shorter than a lower staircase step closer to the backside of the film stack 335.

The 3D memory device 1500 also includes the insulating layer 660 disposed on the staircase structure 657. In some embodiments, the insulating layer 660 can have a coplanar surface with the film stack 335 in the channel structure region 211.

The 3D memory device 1500 also includes the ACS 1580 (i.e., the second semiconductor layer) disposed on the backside of the film stack 335, wherein the staircase steps 659 closer to the ACS 1580 are longer and the staircase steps 659 farther away from the ACS 1580 are shorter. Namely, an upper conductive layer located farther away from the ACS (i.e., farther away from the backside of the film stack 335) is terminated at a shorter length than a lower conductive layer located closer to the ACS (i.e., closer to the backside of the film stack 335). The ACS 1580 can include one or more polycrystalline silicon layers. The one or more polycrystalline silicon layers can be doped with n-type or p-type dopants.

The 3D memory device 1500 also includes memory strings 212 in the channel structure region 211, wherein the memory strings 212 vertically penetrate through the film stack 335 in the second direction. In some embodiments, the memory strings 212 extend into the ACS 1580. In some embodiments, the memory strings 212 can have a cylindrical shape. The memory string 212 can include the core filler 339 in a center, where the core filler 339 can be surrounded by the channel layer 338. The channel layer 338 covers an outer sidewall of the core filler 339. The memory string 212 can also include the memory film 337 covering an outer sidewall of the channel layer 338, i.e., surrounding the channel layer 338 in the first and third directions. The memory film 337 can be a composite layer including a tunneling layer 3373, a storage layer 3372 (also known as "charge trapping layer"), and a blocking layer 3371. In some embodiments, the tunneling layer 3373, the storage layer 3372, and the blocking layer 3371 are arranged along a direction from a center of the memory string 212 toward the outer of the memory string 212 in the above order. The 3D memory device 1500 includes vertically stacked memory cells 340. The memory cell 340 is formed at an intersection between the conductive layer 870 and the memory string 212. The conductive layers 870 can form the word lines 333 in FIG. 3 to address the memory cells 340.

In some embodiments, the memory string 212 also include an epitaxial plug (not shown in FIG. 15) at the bottom of the memory string 212 (closer to the ACS 1580). The epitaxial plug can be connected to the channel layer 338 of the memory string 212.

In some embodiments, the memory string 212 can also include the channel top plug 762 at a first end of the memory string that is located on the front side of the film stack 335. The channel top plug 762 is configured to provide electrical contact to the channel layer 338 from the front side of the film stack 335. Bit lines (not shown) of the 3D memory device 1500 can address the memory cells 340 through the channel top plug 762 from the front side of the film stack 335.

In the second direction perpendicular to the film stack 335, the core filler 339, the channel layer 338 and the memory film 337 extend through the film stack 335. In some embodiments, at least one of the core filler 339, the channel layer 338 and the memory film 337 can further extend into the ACS 1580.

The ACS 1580 contacts the channel layer 338 of the memory string 212 at a second end of the memory string that is located on the backside of the film stack 335 to provide electrical connections to the channel layer 338 from the backside of the film stack 335. In some embodiments, the ACS 1580 surrounds a portion of the memory string 212 that extend into the ACS 1580, where the memory film 337 is removed from this portion of the memory string 212 and thereby the ACS 1580 is in contact with the channel layer 388. In the other words, in the second direction, the memory film 337 covers a first portion of the channel layer 388 and the ACS 1580 covers a second portion of the channel layer 388. The contact area between the channel layer 388 and the ACS 1580 can be increased by further pulling back the memory film 337 away from the ACS 1580 (or towards the front side of the film stack 335). As such, contact resistance between the ACS 1580 and the channel layer 388 can be reduced and performance of the 3D memory device 1500 can be improved.

The 3D memory device 1500 also includes the GLS 216 penetrating through the film stack 335 in the second direction. In some embodiments, the GLS 216 extends further into the ACS 1580. As noted previously, the cross-sectional view in FIG. 15 is drawn along the line AA' in FIG. 2, where it should be understood that the GLS 216 (or the slit structure 216) extends parallel to the staircase structure 657. The cross-sectional view of the GLS 216 is along the third direction perpendicular to the first direction.

In some embodiments, the GLS 216 can include the GLS filler 1278 in a center. In some embodiments, the GLS 216 includes one or more isolation layers covering an outer sidewall of the GLS filler 1278. For example, the GLS 216 can include the second GLS isolation layer 1176 covering the outer sidewall of the GLS filler 1278. The GLS 216 can also include the first GLS isolation layer 974 covering an outer sidewall of the second GLS isolation layer 1176. In some embodiments, the GLS 216 further includes the gate dielectric layer 872 covering an outer sidewall of the first GLS isolation layer 974. In the third direction, the gate dielectric layer 872 can be between the first dielectric layer 656 and the first GLS isolation layer 974. In the first direction, the gate dielectric layer 872 can also be between the conductive layer 870 and the memory film 337. In the second direction, the gate dielectric layer 872 can also be between the conductive layer 870 and the first dielectric layer 656.

In some embodiments, the GLS filler 1278, the first GLS isolation layer 974, the second GLS isolation layer 1176 and the gate dielectric layer 872 extend through the film stack 335 in the second direction perpendicular to the film stack 335. In some embodiments, at least one of the GLS filler 1278, the first GLS isolation layer 974, the second GLS isolation layer 1176 and the gate dielectric layer 872 can further extend into the ACS 1580 in the second direction. In the third direction, the first GLS isolation layer 974 extends through the gate dielectric layer 872 and contacts the conductive layers 872. The GLS 216 is configured to separate the conductive layer 870 into independently controllable word lines (e.g., the WL 333 in FIG. 3).

In some embodiments, the ACS 1580 contacts the GLS filler 1278 at a second end of the GLS 216 that is located on the backside of the film stack 335 to provide electrical connections to the GLS filler 1278 from the backside of the film stack 335. In some embodiments, the ACS 1580 surrounds a portion of the GLS filler 1278 that extend into the ACS 1580, where the second GLS isolation layer 1176 is removed from the portion of the GLS filler 1278 and thereby the ACS 1580 is in contact with the GLS filler 1278. In the other words, the second GLS isolation layer 1176 covers a first portion of the GLS filler 1278 and the ACS 1580 covers a second portion of the GLS filler 1278. The contact area between the GLS filler 1278 and the ACS 1580 can be increased by further pulling back the second GLS isolation layer 1176 away from the ACS 1580 (or towards the front side of the film stack 335). As such, contact resistance between the ACS 1580 and the second GLS isolation layer 1176 can be reduced and performance of the 3D memory device 1500 can be improved.

In some embodiments, the 3D memory device 1500 also includes the second etch-stop layer 552 located in between the film stack 335 and the ACS 1580. The distance between the film stack 335 and the ACS 1580 can be determined by the thickness of the second etch-stop layer 552. In some embodiments, at least one of the GLS filler 1278, the first GLS isolation layer 974, the second GLS isolation layer 1176 and the gate dielectric layer 872 can extend into or through the second etch-stop layer 552 in the second direction. In some embodiments, at least one of the core filler 339, the channel layer 338 and the memory film 337 can extend into or through the second etch-stop layer 552 in the second direction.

In some embodiments, the 3D memory device 1500 also includes the first capping layer 666 and the second capping layer 768 disposed on the front side of the film stack 335, where the second capping layer 768 covers the first end of the memory string 212. In some embodiments, the memory string 212 is coplanar with the first capping layer 666. In some embodiments, the GLS 216 is coplanar with the second capping layer 768.

In some embodiments, the second end of the channel layer 338 of the memory string 212 can be connected through the ACS 1580 from the backside of the film stack 335, where the ACS 1580 can function as a source terminal. The first end of the channel layer 338 of the memory string 212 can be connected through the channel top plug 762 from the front side of the film stack 335, which can function as a drain terminal. While the drain terminal of the memory string 212 can be connected to a bit line, the source terminals of the memory strings 212 in the same memory block (or sub-block) can be connected together through the ACS 1580. The ACS 1580 formed on the backside of the film stack 335 can save area and increase storage capacity for the 3D memory device 1500.

As shown in FIG. 15, the 3D memory device 1500 includes a first sub-storage unit 1682 and a second sub-storage unit 1684, wherein the first sub-storage unit 1682 and the second sub-storage unit 1684 can share the same ACS 1580. Namely, the memory strings 212 in the first sub-storage unit 1682 and the second sub-storage unit 1684 can be in contact with the same ACS 1580. More specifically, the channel layers 338 of the memory strings 212 in the first sub-storage unit 1682 and the second sub-storage unit 1684 can contact the same ACS 1580. Because the GLS filler 1278 of the GLS 216 can also contact the ACS 1580, the channel layers 338 of the memory strings 212 in the first sub-storage unit 1682 and the second sub-storage unit 1684 can be electrically connected to the GLS filler 1278 and the shared ACS 1580.

In some embodiments, the first sub-storage unit 1682 and the second sub-storage unit 1684 can be the memory fingers 218 separated by the GLS 216 as shown in FIG. 2, where the GLS 216 extends laterally in a direction parallel to the word line (or in the WL direction). In some embodiments, the first sub-storage unit 1682 and the second sub-storage unit 1684 can perform read or program operations independently. For example, the first sub-storage unit 1682 can be selected to perform a read or program operation while the second sub-storage unit 1684 can be unselected without performing the read or program operation. If the GLS filler 1278 is floating, i.e., not applied with any bias (or not connected to any electric voltage), charge carriers can accumulate around the second sub-storage unit 1684 due to capacitive coupling between the first sub-storage unit 1682 and the second sub-storage unit 1684. The accumulated charge carriers around the second sub-storage unit 1684 can affect logic states of the memory cells 340 (or storage data) in the memory strings 212 in the second sub-storage unit 1684, and thereby affect the performance and reliability of the 3D memory device 1500.

In the present disclosure, the GLS filler 1278 of the GLS 216 contacts the ACS 1580, and can be electrically connected to the ACS 1580. In some embodiments, the GLS filler 1278 and the ACS 1580 can be grounded (i.e., applied with a zero voltage). In this example, charge carriers accumulated around the second sub-storage unit 1684 due to capacitive coupling between the first sub-storage unit 1682 and the second sub-storage unit 1684 can be removed through the GLS filler 1278 and/or the ACS 1580. As such, capacitive coupling effect between the first sub-storage unit 1682 and the second sub-storage unit 1684 can be reduced. Disturbance to the logic states of the memory cells 340 (or storage data stored) in the second sub-storage unit 1684 can thereby be reduced.

Figure 16:
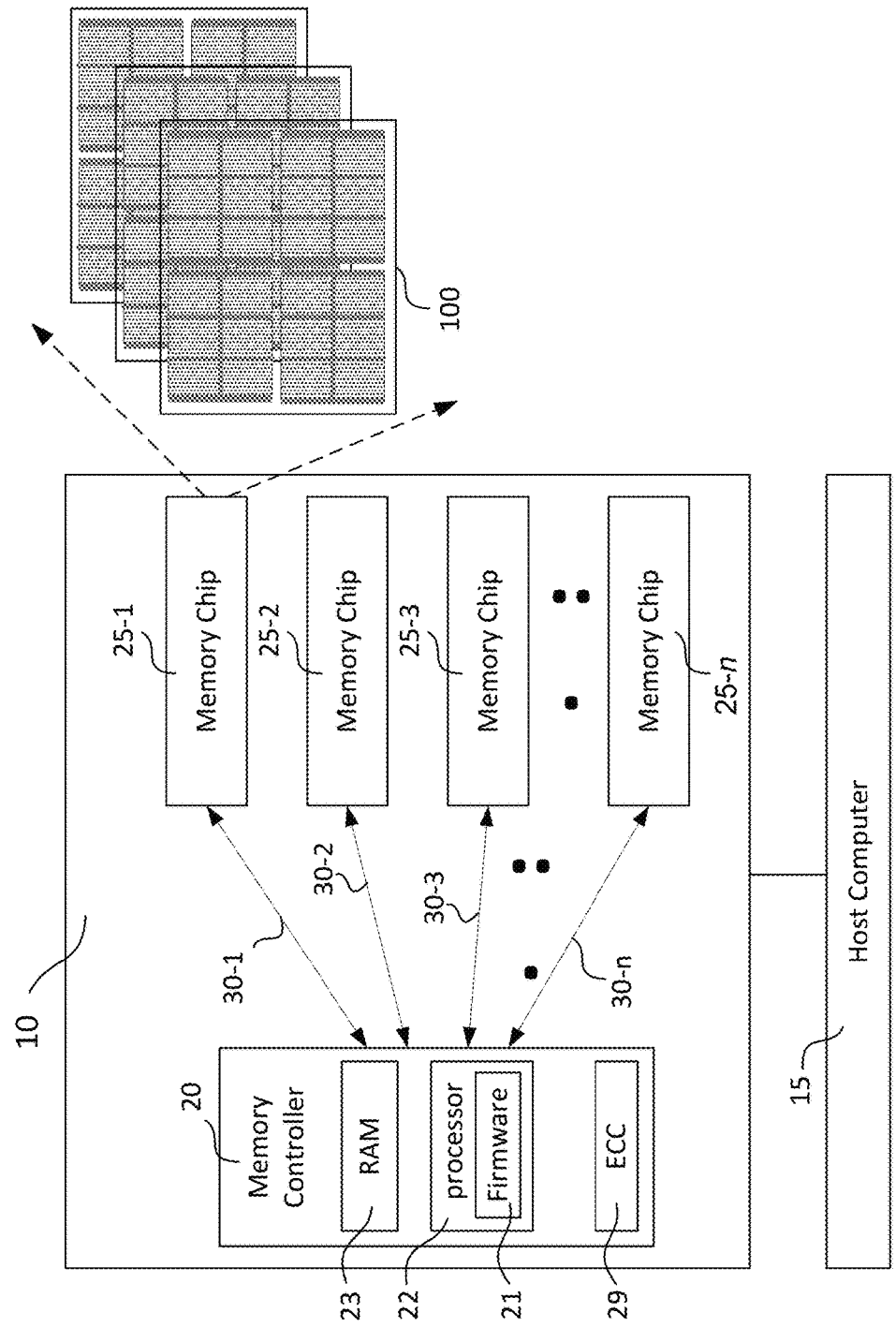
FIGS. 16 and 17A-17B illustrate a storage system with one or more memory chips, according to some embodiments of the present disclosure.

FIG. 16 illustrates a block diagram of an exemplary system Si having a storage system 10, according to some embodiments of the present disclosure. System Si can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. The storage system 10 (also referred to as a NAND storage system) can include a memory controller 20 and one or more semiconductor memory chips 25-1, 25-2, 25-3, . . . , 25-n. Each semiconductor memory chip 25 (hereafter just "memory chip") can be a NAND chip (i.e., "flash," "NAND flash" or "NAND"). The storage system 10 can communicate with a host computer 15 through the memory controller 20, where the memory controller 20 can be connected to the one or more memory chips 25-1, 25-2, 25-3, . . . , 25-n, via one or more memory channels 30-1, 30-2, 30-3, . . . , 30-n. In some embodiments, each memory chip 25 can be managed by the memory controller 20 via a memory channel 30.

In some embodiments, the host computer 15 can include a processor of an electronic device, such as a central processing unit (CPU), or a system-on-chip (SoC), such as an application processor (AP). The host computer 15 sends data to be stored at the NAND storage system or storage system 10 or retrieves data by reading the storage system 10.

The memory controller 20 can handle I/O requests received from the host computer 15, ensure data integrity and efficient storage, and manage the memory chip 25. To perform these tasks, the controller runs firmware 21, which can be executed by one or more processors 22 (e.g., microcontroller units, CPU) inside the controller 20. For example, the controller 20 runs firmware 21 to map logical addresses (i.e., address utilized by the host associated with host data) to physical addresses in the memory chip 25 (i.e., actual locations where the data is stored). The controller 20 also runs firmware 21 to manage defective memory blocks in the memory chip 25, where the firmware 21 can remap the logical address to a different physical address, i.e., move the data to a different physical address. The controller 20 can also include one or more memories 23 (e.g., DRAM, SRAM, EPROM, etc.), which can be used to store various metadata used by the firmware 21. In some embodiments, the memory controller 20 can also perform error recovery through an error correction code (ECC) engine 29. ECC can be used to detect and correct the raw bit errors that occur within each memory chip 25.

The memory channels 30 can provide data and control communication between the memory controller 20 and each memory chip 25 via a data bus. The memory controller 20 can select one of the memory chip 25 according to a chip enable signal.

In some embodiments, each memory chip 25 in FIG. 16 can include one or more memory dies 100, where each memory die can be the 3D NAND memory 100 as shown in FIGS. 1-3. In some embodiments, each of the one or more memory dies 100 can include the 3D memory device 1500 shown in FIG. 15, which can be fabricated using the method 400 in FIG. 4. The memory controller 20 can be coupled to the memory die 100 (e.g., the 3D NAND memory device 100) and configured to control the 3D NAND memory device 100.

Figure 17A:
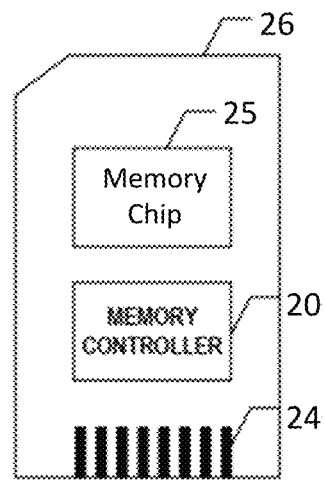
Figure 17B:
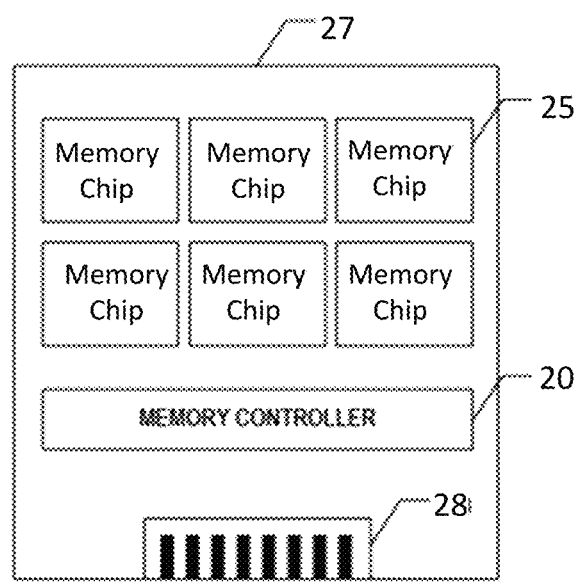

Memory controller 20 and one or more memory chip 25 can be integrated into various types of storage devices, for example, be included in the same package, such as a universal Flash storage (UFS) package or an eMMC package. That is, storage system 10 can be implemented and packaged into different types of end electronic products. In one example as shown in FIG. 17A, memory controller 20 and a single memory chip 25 can be integrated into a memory card 26. Memory card 26 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 26 can further include a memory card connector 24 coupling memory card 26 with a host (e.g., the host computer 15 in FIG. 16). In another example as shown in FIG. 17B, memory controller 20 and multiple memory chip 25 can be integrated into an solid state drive (SSD) 27. SSD 27 can further include an SSD connector 28 coupling SSD 27 with a host (e.g., the host computer 15 in FIG. 16).

Figure 18:
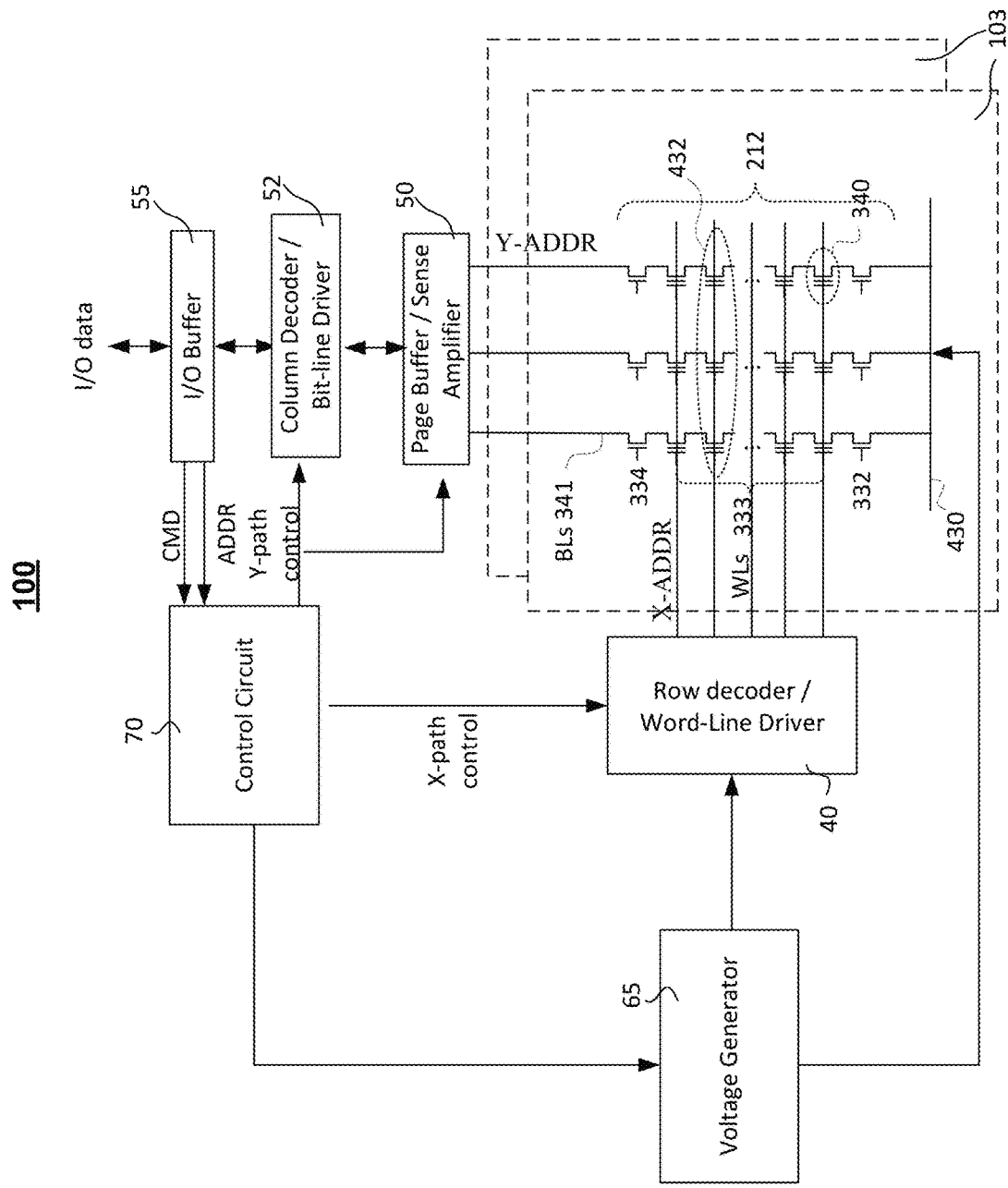
FIG. 18 illustrates a schematic of a three-dimensional (3D) memory die, according to some embodiments of the present disclosure.

FIG. 18 illustrates a schematic diagram of the memory die 100, according to some embodiments of the present disclosure. The memory die 100 includes one or more memory blocks 103 (e.g., 103-1, 103-2, 103-3). Each memory block 103 includes memory strings 212. Each memory string 212 includes memory cells 340. The memory cells 340 sharing the same word line forms a memory page 432. The memory string 212 can also include at least one field effect transistor (e.g., MOSFET) at each end, which is controlled by a bottom select gate (BSG) 332 and a top select gate (TSG) 334, respectively. The drain terminal of a top select transistor 334-T can be connected to the bit line 341, and the source terminal of a bottom select transistor 332-T can be connected to an array common source (ACS) 430. The ACS 430 can be shared by the memory strings 212 in an entire memory block, and is also referred to as the common source line.

In some embodiments, the ACS 430 can include the ACS 1580 shown in FIG. 15 and can be fabricated using the method 400 shown in FIG. 4. In this example, the memory die 100 can include the 3D memory device 1500 shown in FIG. 15.

The memory die 100 can also include a periphery circuit that includes many digital, analog, and/or mixed-signal circuits to support functions of the memory block 103, for example, a page buffer/sense amplifier 50, a row decoder/word line driver 40, a column decoder/bit line driver 52, a control circuit 70, a voltage generator 65 and an input/output buffer 55. These circuits can include active and/or passive semiconductor devices, such as transistors, diodes, capacitors, resistors, etc., as would be apparent to a person of ordinary skill in the art.

The memory blocks 103 can be coupled with the row decoder/word line driver 40 via word lines ("WLs") 333, bottom select gates ("BSGs") 332 and top select gates ("TSGs") 334. The memory blocks 103 can be coupled with the page buffer/sense amplifier 50 via bit lines ("BLs") 341.

The row decoder/word line driver 40 can select one of the memory blocks 103 on the memory die 100 in response to a X-path control signal provided by the control circuit 70. The row decoder/word line driver 40 can transfer voltages provided from the voltage generator 65 to the word lines according to the X-path control signal. During the read and program operation, the row decoder/word line driver 40 can transfer a read voltage $V_{read}$ and a program voltage $V_{pgm}$ to a selected word line and a pass voltage $V_{pass}$ to an unselected word line according to the X-path control signal received from the control circuit 70.

The column decoder/bit line driver 52 can transfer an inhibit voltage $V_{inhibit}$ to an unselected bit line and connect a selected bit line to ground according to a Y-path control signal received from the control circuit 70. In the other words, the column decoder/bit line driver 52 can be configured to select or unselect one or more memory strings 212 according to the Y-path control signal from the control circuit 70. The page buffer/sense amplifier 50 can be configured to read and program (write) data from and to the memory block 103 according to the control signal Y-path control from the control circuit 70. For example, the page buffer/sense amplifier 50 can store one page of data to be programmed into one memory page 432. In another example, page buffer/sense amplifier 50 can perform verify operations to ensure that the data has been properly programmed into each memory cell 340. In yet another example, during a read operation, the page buffer/sense amplifier 50 can sense current flowing through the bit line 341 that reflects the logic state (i.e., data) of the memory cell 340 and amplify small signal to a measurable magnification.

The input/output buffer 55 can transfer the I/O data from/to the page buffer/sense amplifier 50 as well as addresses ADDR or commands CMD to the control circuit 70. In some embodiments, the input/output buffer 55 can function as an interface between the memory controller 20 (in FIG. 1) and the memory die 100 on the memory chip 25.

The control circuit 70 can control the page buffer/sense amplifier 50 and the row decoder/word line driver 40 in response to the commands CMD transferred by the input/output buffer 55. During the program operation, the control circuit 70 can control the row decoder/word line driver 40 and the page buffer/sense amplifier 50 to program a selected memory cell. During the read operation, the control circuit 70 can control the row decoder/word line driver 40 and the page buffer/sense amplifier 50 to read a selected memory cell. The X-path control signal and the Y-path control signal include a row address X-ADDR and a column address Y-ADDR that can be used to locate the selected memory cell in the memory block 103. The row address X-ADDR can include a page index PD, a block index BD and a plane index PL to identify the memory page 432, memory block 103, and memory plane 101 (in FIG. 1), respectively. The column address Y-ADDR can identify a byte or a word in the data of the memory page 432.

The voltage generator 65 can generate voltages to be supplied to word lines and bit lines under the control of the control circuit 70. The voltages generated by the voltage generator 65 include the read voltage $V_{read}$, the program voltage $V_{pgm}$, the pass voltage $V_{pass}$, the inhibit voltage $V_{inhibit}$, etc.

In summary, the present disclosure provides a method for forming a three-dimensional (3D) memory device. The method includes forming a dielectric stack on a substrate, and forming a first opening penetrating through the dielectric stack and extending into the substrate from a first side of the dielectric stack that is farther away from the substrate.

The method also includes forming a first layer and a second layer inside the first opening from the first side of the dielectric stack, wherein the first layer covers a sidewall and a bottom of the first opening. The method further includes removing a portion of the first layer located at the bottom of the first opening from a second side of the dielectric stack to expose a portion of the second layer, wherein the second side of the dielectric stack is opposite to the first side of the dielectric stack. The method further includes forming a second semiconductor layer from the second side of the dielectric stack to contact the exposed portion of the second layer.

In some embodiments, the method further includes, prior to removing the portion of the first layer, removing the substrate from the second side of the dielectric stack to expose the portion of the first layer located at the bottom of the first opening.

In some embodiments, the removing the substrate includes removing a handle wafer selectively over an insulator layer; removing the insulator layer selectively over a first semiconductor layer; and removing the first semiconductor layer selectively over the first layer.

In some embodiments, the method also includes, prior to forming the dielectric stack, disposing a first etch-stop layer and a second etch-stop layer on the substrate; and disposing the dielectric stack on the second etch-stop layer.

In some embodiments, the method further includes removing the substrate selectively over the first etch-stop layer and the first layer from the second side of the dielectric stack to expose the portion of the first layer located at the bottom of the first opening.

In some embodiments, the method further includes removing the exposed portion of the first layer and the first etch-stop layer selectively over the second etch-stop layer from the second side of the dielectric stack to expose the portion of the second layer.

In some embodiments, the method also includes disposing the second semiconductor layer on the second etch-stop layer and the exposed portion of the second layer from the second side of the dielectric stack.

In some embodiments, the forming the second semiconductor layer to contact the exposed portion of the second layer includes disposing an array common source to contact the exposed portion of the second layer.

In some embodiments, the method also includes forming a channel hole penetrating through the dielectric stack and extending into the substrate from the first side of the dielectric stack; forming a memory film and a channel layer on a sidewall and a bottom of the channel hole from the first side of the dielectric stack; removing a portion of the memory film located at the bottom of the channel hole to expose a portion of the channel layer form the second side of the dielectric stack; and forming the second semiconductor layer to contact the exposed portion of the channel layer from the second side of the dielectric stack.

In some embodiments, the method further includes forming a gate line slit (GLS) opening penetrating through the dielectric stack and extending into the substrate from the first side of the dielectric stack; forming a second GLS isolation layer and a GLS filler inside the GLS opening from the first side of the dielectric stack; removing a portion of the second GLS isolation layer to expose a portion of the GLS filler from the second side of the dielectric stack; and forming the second semiconductor layer to contact the exposed portion of the second GLS isolation layer from the second side of the dielectric stack.

In some embodiments, the method further includes, prior to forming the second GLS isolation layer, disposing a first sub-layer insulator inside the GLS opening at a first temperature; disposing a second sub-layer insulator on the first sub-layer insulator inside the GLS opening at a second temperature higher than the first temperature; and removing portions of the first sub-layer insulator and the second sub-layer insulator located on the bottom of the GLS opening to expose a portion of the substrate.

In some embodiments, the forming the dielectric stack includes disposing, alternatingly, a first dielectric layer and a second dielectric layer on the substrate.

In some embodiments, the method further includes replacing the second dielectric layer with a conductive layer through the GLS opening to form a film stack of alternating conductive and dielectric layers.

The present disclosure also provides a three-dimensional (3D) memory device. The 3D memory device includes a film stack of alternating conductive and dielectric layers, and a gate line slit (GLS) penetrating through the film stack in a second direction, wherein the GLS includes a second GLS isolation layer extending through the film stack in the second direction and covering an outer sidewall of a GLS filler. The 3D memory device further includes a second semiconductor layer disposed on a backside of the film stack. The GLS filler extends through the film stack in the second direction and contacts the second semiconductor layer.

In some embodiments, the film stack includes a conductive layer and a dielectric layer alternatingly stacked in the second direction.

In some embodiments, the GLS further includes a first GLS isolation layer covering an outer sidewall of the second GLS isolation layer. The first GLS isolation layer extends through the film stack in the second direction and extends into the conductive layer in a third direction that is perpendicular to the second direction.

In some embodiments, the 3D memory device further includes a gate dielectric layer covering an outer sidewall of the first GLS isolation layer and extending through the film stack in the second direction. The first GLS isolation layer extends through the gate dielectric layer into the conductive layer in the third direction.

In some embodiments, the 3D memory device further includes a staircase structure formed in the film stack. The staircase structure includes a plurality of staircase steps. An upper staircase step farther away from the backside of the film stack is shorter than a lower staircase step closer to the backside of the film stack.

In some embodiments, the second semiconductor layer includes polycrystalline silicon.

In some embodiments, the GLS filler includes polycrystalline silicon.

In some embodiments, the 3D memory device further includes a second etch-stop layer between the film stack and the second semiconductor layer.

The present disclosure also provides a three-dimensional (3D) memory device having a film stack of alternating conductive and dielectric layers and a memory string penetrating through the film stack in a second direction. The memory string includes a memory film covering an outer sidewall of a channel layer. The 3D memory device also includes a second semiconductor layer disposed on a backside of the film stack. The channel layer extends through the film stack in the second direction and contacts the second semiconductor layer.

In some embodiments, the 3D memory device further includes a gate dielectric layer, disposed between the dielectric layer and the conductive layer of the film stack in the second direction, and disposed between the memory film and the conductive layer in a first direction perpendicular to the second direction.

The present disclosure further provides a memory storage system including a three-dimensional (3D) memory device. The 3D memory device includes a film stack of alternating conductive and dielectric layers and a gate line slit (GLS) penetrating through the film stack in a second direction. The GLS includes a second GLS isolation layer extending through the film stack in the second direction and covering an outer sidewall of a GLS filler. The 3D memory device also includes a second semiconductor layer disposed on a backside of the film stack. The GLS filler extends through the film stack in the second direction and contacts the second semiconductor layer. The memory storage system also includes a memory controller coupled to the 3D memory device and configured to control the 3D memory device.

The present disclosure further provides a memory storage system including a three-dimensional (3D) memory device. The 3D memory device includes a film stack of alternating conductive and dielectric layers; and a memory string penetrating through the film stack in a second direction, wherein the memory string includes a memory film covering an outer sidewall of a channel layer. The 3D memory device also includes a second semiconductor layer disposed on a backside of the film stack, wherein the channel layer extends through the film stack in the second direction and contacts the second semiconductor layer. The memory storage system also includes a memory controller coupled to the 3D memory device and configured to control the 3D memory device.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:

forming a dielectric stack on a substrate;

forming a first opening penetrating through the dielectric stack and extending into the substrate from a first side of the dielectric stack that is farther away from the substrate;

forming a first layer and a second layer inside the first opening from the first side of the dielectric stack, wherein the first layer covers a sidewall and a bottom of the first opening;

removing the substrate from a second side of the dielectric stack to expose a portion of the first layer located at the bottom of the first opening, wherein the second side of the dielectric stack is opposite to the first side of the dielectric stack;

removing the portion of the first layer located at the bottom of the first opening from the second side of the dielectric stack to expose a portion of the second layer; and after removing a first semiconductor layer, forming a second semiconductor layer from the second side of the dielectric stack to contact the exposed portion of the second layer.

2. The method of claim 1, wherein the removing the substrate includes:

removing a handle wafer from an insulator layer;

removing the insulator layer from the first semiconductor layer; and removing the first semiconductor layer from the first layer.

3. The method of claim 1, further including:

prior to forming the dielectric stack, disposing a first etch-stop layer and a second etch-stop layer on the substrate; and disposing the dielectric stack on the second etch-stop layer.

4. The method of claim 3, further including removing the substrate from the first etch-stop layer and the first layer from the second side of the dielectric stack to expose the portion of the first layer located at the bottom of the first opening.

5. The method of claim 4, further including removing the exposed portion of the first layer and the first etch-stop layer from the second etch-stop layer from the second side of the dielectric stack to expose the portion of the second layer.

6. The method of claim 5, further including disposing the second semiconductor layer on the second etch-stop layer and the exposed portion of the second layer from the second side of the dielectric stack.

7. The method of claim 1, wherein the forming the second semiconductor layer to contact the exposed portion of the second layer includes disposing an array common source to contact the exposed portion of the second layer.

8. The method of claim 1, wherein the forming the first opening, the forming the first layer and the second layer, the removing the portion of the first layer, and the forming the second semiconductor layer include:

forming a channel hole penetrating through the dielectric stack and extending into the substrate from the first side of the dielectric stack;

forming a memory film and a channel layer on a sidewall and a bottom of the channel hole from the first side of the dielectric stack;

removing a portion of the memory film located at the bottom of the channel hole to expose a portion of the channel layer from the second side of the dielectric stack; and forming the second semiconductor layer to contact the exposed portion of the channel layer from the second side of the dielectric stack.

9. The method of claim 1, wherein the forming the first opening, the forming the first layer and the second layer, the removing the portion of the first layer, and the forming the second semiconductor layer include:
  forming a gate line slit (GLS) opening penetrating through the dielectric stack and extending into the substrate from the first side of the dielectric stack;
  after forming a first GLS isolation layer, forming a second GLS isolation layer and a GLS filler inside the GLS opening from the first side of the dielectric stack;
  removing a portion of the second GLS isolation layer to expose a portion of the GLS filler from the second side of the dielectric stack; and
  forming the second semiconductor layer to contact the exposed portion of the second GLS isolation layer from the second side of the dielectric stack.

10. The method of claim 9, further including:
  prior to forming the second GLS isolation layer, disposing a first sub-layer insulator inside the GLS opening at a first temperature;
  disposing a second sub-layer insulator on the first sub-layer insulator inside the GLS opening at a second temperature higher than the first temperature; and
  removing portions of the first sub-layer insulator and the second sub-layer insulator located on the bottom of the GLS opening to expose a portion of the substrate.

11. The method of claim 9, wherein the forming the dielectric stack includes disposing, alternatingly, a first dielectric layer and a second dielectric layer on the substrate.

12. The method of claim 11, further including replacing the second dielectric layer with a conductive layer through the GLS opening to form a film stack of alternating conductive and dielectric layers.

* * * * *